United States Patent
Hayles

(10) Patent No.: US 7,134,109 B2
(45) Date of Patent: Nov. 7, 2006

(54) PARAMETER ORIENTED GRAPHICAL REPRESENTATION OF HARDWARE TIMING AND TRIGGERING CAPABILITIES WITH CONTEXTUAL INFORMATION

(75) Inventor: Timothy J. Hayles, Austin, TX (US)

(73) Assignee: National Instruments Corporation, Austin, TX (US)

( * ) Notice: Subject to any disclaimer, the term of this patent is extended or adjusted under 35 U.S.C. 154(b) by 369 days.

(21) Appl. No.: 10/361,661

(22) Filed: Feb. 10, 2003

(65) Prior Publication Data

US 2004/0158804 A1 Aug. 12, 2004

(51) Int. Cl.
*G06F 17/50* (2006.01)

(52) U.S. Cl. ............................................. 716/6; 716/12

(58) Field of Classification Search ............... 716/2, 716/6, 14, 12, 17; 345/440; 327/58; 702/127
See application file for complete search history.

(56) References Cited

U.S. PATENT DOCUMENTS

| | | | |
|---|---|---|---|
| 4,564,804 A * | 1/1986 | Wilke et al. | 327/58 |
| 4,812,996 A | 3/1989 | Stubbs | |
| 4,868,785 A | 9/1989 | Jordan et al. | |
| 5,974,257 A | 10/1999 | Austin | |
| 6,763,506 B1 * | 7/2004 | Betz et al. | 716/6 |
| 6,873,928 B1 * | 3/2005 | Thurman et al. | 702/127 |
| 6,880,130 B1 | 4/2005 | Makowski et al. | |
| 2003/0184596 A1 | 10/2003 | Kodosky | |
| 2004/0032412 A1 * | 2/2004 | Odom | 345/440 |

* cited by examiner

Primary Examiner—Thuan Do
(74) Attorney, Agent, or Firm—Meyertons Hood Kivlin Kowert & Goetzel, P.C.; Jeffrey C. Hood

(57) ABSTRACT

System and method for graphically specifying hardware timing and triggering. A diagram is displayed graphically representing user-configurable timing and triggering components of a device, e.g., icons and signal paths representing operational relationships between the components, where timing and triggering for the device is determined by timing and triggering attributes. The diagram receives user input specifying one or more of the timing and triggering attributes, e.g., parameters, signal routes, etc., and the diagram modified, e.g., graphically configured, in accordance with the specified attributes, where the diagram represents configuration of the user-configurable timing and triggering components. Dependent attributes are programmatically computed based on the specified attributes. The specified attributes are stored and are usable to configure timing and triggering for the device. Program code for configuring the device may be generated based on the diagram. A state diagram may be displayed indicating effects of modifying the diagram on operation of the device.

43 Claims, 24 Drawing Sheets

Computer System
102

Computer System
102 computer system
90

US 7,134,109 B2

PARAMETER ORIENTED GRAPHICAL REPRESENTATION OF HARDWARE TIMING AND TRIGGERING CAPABILITIES WITH CONTEXTUAL INFORMATION

FIELD OF THE INVENTION

The present invention relates to the field of measurement and automation, and more particularly to a system and method for graphically representing and specifying hardware timing and triggering capabilities with contextual information.

DESCRIPTION OF THE RELATED ART

Increasingly, scientific and engineering tasks are performed using computer-based systems, where a computer system e.g., a personal computer or workstation, performs much of the processing, analysis, or control for applications. In many of these systems, the computer system includes or couples to one or more devices, and executes software to perform a desired function using the one or more devices. Such computer-based systems include, but are not limited to, test and measurement systems, automation systems, control systems, network management systems, and simulation systems, such as rapid prototyping systems, etc., among others. Such systems often use a device, such as a data acquisition (DAQ) hardware card or board, to acquire, generate, and/or route data. Such devices generally have a number of components for timing and triggering operations related to the acquisition and/or generation of data.

For example, a measurement device such as an E Series board from National Instruments Corporation employs a series of clocks (counters) to produce the timing signals required for conducting data capture or data generation. FIG. 1 illustrates the counters involved in the analog input section of a National Instruments E Series board. These counters each count edges of an input signal and, when a programmed number of edges have been counted, each produces an output signal. Each of these counters can be configured in a variety of ways to support a variety of timing use cases, such as, for example, the source of the signal each counts, the number of edges of the signal counted, and often, the polarity of the signal. Additionally, the output of counters may be exported to other counters within the device and/or to other devices, where the polarity of the exported signal is often configurable. All of these configuration options are generally constrained by the design of the measurement device and by the configuration of the rest of the device. Various examples of timing operations are described below.

It may be desired that data capture and data generation on a single device be such that each data point is captured or generated at the same time, thus, one or more timing signals may be shared among the data capture and data generation circuits on the same device. In this case, the outputs of some counters will be exported from the data capture circuit to the data generation circuit and the sources of some counters on the data generation circuit will be imported from the data capture circuit.

It may be desired that two or more devices capture or generate data such that each data point is captured or generated at the same time, thus, one or more timing signals may be shared among the devices. In this case, the outputs of some counters will be exported to the second device and the sources of some counters on the second device will be imported from the first device.

It may be desired that a measurement device acquire or generate data in response to a falling edge signal produced by another device. In this case the source of a counter may be configured to be a connector where the signal produced by the other device is available. The source of the counter may then be configured to respond to the falling edge of the external device's signal.

It may be desired that a measurement device acquire or generate data once for every n (e.g., 10) edges received from an external device. In this case the source of a counter may be configured to be a connector where the signal produced by the other device is available, and the counter may also be configured to count n (e.g., 10) edges of this signal.

It may be desired that a measurement device acquire or generate data some time after a falling edge signal produced by another device is received. In this case a counter may be configured to produce this delay.

Measurement devices, such as an E Series board from National Instruments, often employ digital trigger circuitry to aid in conducting data capture or data generation. There are various types of triggers that provide the stimulus for different aspects of data capture or generation. Some of these aspects are starting, pausing, and resuming the capture or generation of data. These trigger circuits can be configured in a variety of ways to support a variety of triggering use cases. For example, the sources of the triggers and the polarity of each source are generally configurable. Additionally, the output of the triggers is often exportable to other trigger circuits with a device and/or to other devices. As noted above, these configuration options are generally constrained by the design of the measurement device and by the configuration of the rest of the device. Examples of triggering operations follow.

It may be desired that data capture and data generation within a device begin generating and acquiring data at the same time. In this case the start trigger of the data capture may be exported and the start trigger of the data generation within the same device may receive this exported trigger.

It may be desired that two or more measurement devices begin generating or acquiring data at the same time. In this case the start trigger of one device may be exported and the start trigger of the other devices may receive this exported trigger.

It may be desired that a measurement device begin generating or acquiring data in response to a rising edge of a signal generated by an external device. In this case the source of the start trigger of the measurement device may be configured to be a connector where the external device's signal is available. The polarity of the start trigger of the measurement device may be configured such that the device will respond only to the rising edge of the external signal.

Measurement devices, such as an E Series board from National Instruments, often employ analog trigger circuitry to aid in conducting data capture or generation. The purpose of this circuitry is to compare an analog signal with a set of signal properties. When the analog signal matches the set of signal properties, this circuit produces a digital signal signifying the match. The set of signal properties is generally configurable. For example, the source of the analog signal is configurable. Additionally, the digital signal produced by this circuit may be exported to other circuits on the device or to other devices. As noted above, all of these configuration options are generally constrained by the design of the measurement device and by the configuration of the rest of the device. Examples of analog triggering operations are presented below.

It may be desired that a measurement device pause data generation when an analog signal is within a window defined by an upper and lower limit. The analog trigger circuitry must be configured to accept the analog signal as input. The analog trigger circuitry may be configured to toggle its output whenever the analog signal enters or leaves the window. The output of the analog trigger circuit may be configured to be the source of the data generation pause trigger. The polarity of the pause trigger may be configured such that it matches the polarity of the output of the analog trigger circuit.

Additionally, measurement devices, such as an E Series board from National Instruments, often employ general purpose counter/timers to aid in characterizing digital signals or to generate digital signals. The counters generally have a SOURCE signal input, a GATE signal input, and an OUT signal output. The sources of the input signals are generally configurable, as are the polarities. The number of edges of the SOURCE signal to count is configurable. The effect of changes at the GATE signal on the operation of the counter is configurable. The behavior (pulse/toggle) and polarity of the OUT signal is configurable. The OUT signal is able to be exported to other circuits on the device or to other devices. These configuration options are generally constrained by the design of the measurement device and by the configuration of the rest of the device. Examples of the use of general purpose counter/timers are given below.

It may be desired that a measurement device produce a series of digital pulses at a certain frequency and duty cycle for use by other circuits within the device or by an external device. The SOURCE signal may be configured, the number of SOURCE signal edges to count for both the high and low phases of the duty cycle may be configured, and the OUT signal may be configured to be available at the connector where it can be accessed and used by other circuits within the device or by an external device.

It may be desired that a measurement device measure the period (the elapsed time between two rising or two falling edge) of a digital signal. The SOURCE signal may be configured, and the GATE signal may be configured to be a connector where the digital signal whose period is to be measured is available. The behavior of the counter/timer in response to changes in the GATE signal may be configured.

Measurement devices, such as an E Series board from National Instruments, also generally employ other components to aid in conducting data capture or generation.

These components may include but are not limited to Analog to Digital Converters, Digital to Analog Converters, First-In-First-Out memory, multiplexers and gain amplifiers, among others. These components are generally configurable in various ways to support various analog input waveform capture and analog output waveform generation use cases. All of these configuration options are typically constrained by the design of the measurement device and by the configuration of the rest of the device.

Driver software that exposes the features of a measurement device such as an E Series board from National Instruments employs various software constructions to aid in conducting an analog input waveform capture or an analog output waveform generation.

Examples of these software constructions include a memory buffer, a method or methods of transferring data between the data acquisition board and the memory buffer, and a method or methods of transferring data between the data acquisition board or the memory buffer and the end user's application.

Traditionally, high level text-based programming languages have been used by programmers in writing application programs. Many different high level programming languages exist, including BASIC, C, Java, FORTRAN, Pascal, COBOL, ADA, APL, etc.

Programs written in these high level languages are translated to the machine language level by translators known as compilers or interpreters. The high level programming languages in this level, as well as the assembly language level, are referred to herein as text-based programming environments. Increasingly, however, graphical programming techniques are being used to develop applications. U.S. Pat. Nos. 4,901,221; 4,914,568; 5,291,587; 5,301,301; and U.S. Pat. No. 5,301,336; among others, to Kodosky et al disclose a graphical system and method for modeling a process, i.e., a graphical programming environment which enables a user to easily and intuitively model a process. The graphical programming environment disclosed in Kodosky et al can be considered a higher and more intuitive way in which to interact with a computer as compared to text-based programming approaches. A graphically based programming environment can be represented at a level above text-based high level programming languages such as C, Basic, Java, etc.

The method disclosed in Kodosky et al allows a user to construct a diagram using a block diagram editor. The block diagram may include a plurality of interconnected icons such that the diagram created graphically displays a procedure or method for accomplishing a certain result, such as manipulating one or more input variables and/or producing one or more output variables. In response to the user constructing a diagram or graphical program using the block diagram editor, data structures and/or program instructions may be automatically constructed which characterize an execution procedure that corresponds to the displayed procedure. The graphical program may be compiled or interpreted by a computer.

Therefore, Kodosky et al teaches a graphical programming environment wherein a user places or manipulates icons and interconnects or "wires up" the icons in a block diagram using a block diagram editor to create a graphical "program." A graphical program for performing an instrumentation, measurement or automation function, such as measuring a Unit Under Test (UUT) or device, controlling or modeling instruments, controlling or measuring a system or process, or for modeling or simulating devices, may be referred to as a virtual instrument (VI). Thus, a user can create a computer program solely by using a graphically based programming environment. This graphically based programming environment may be used for creating virtual instrumentation systems, modeling processes, control, simulation, and numerical analysis, as well as for any type of general programming. Thus, graphical programming has become a powerful tool available to programmers. Graphical programming environments such as the National Instruments LabVIEW product have become very popular. Tools such as LabVIEW have greatly increased the productivity of programmers, and increasing numbers of programmers are using graphical programming environments to develop their software applications. In particular, graphical programming tools are being used for test and measurement, data acquisition, process control, man machine interface (MMI), supervisory control and data acquisition (SCADA) applications, simulation, image processing/machine vision applications, and motion control, among others.

Timing, triggering, counter/timer and other configurations have historically been accomplished by setting values on properties or attributes. Various means of setting these attributes have been used, including calling a function in a text based program, e.g., a C program, and calling a Virtual Instrument (VI), e.g., from a LabVIEW program. The configuration constraints imposed by the design of the device and by how other attributes of the device are currently configured are typically discovered by reading separate documents or by trial and error. In addition, a user must typically discover which functions (e.g., C functions) or VIs (e.g., LabVIEW VIs) to call and what values to set on which attributes.

For example, FIG. 2 illustrates a prior art approach to configuring timing and triggering for devices, where two E Series devices from National Instruments are to start at the same time and operate in synchrony. As FIG. 2 shows, in this approach, properties of graphical program nodes or terminals are specified in a LabVIEW program or block diagram, e.g., by selecting attribute options via respective list boxes. Note that each parameter is specified independently from the other parameters, and thus, a substantial amount of user knowledge or expertise is presumed.

As FIG. 2 also shows, Route Signal and Trigger Configuration nodes are included where each has input parameters that may assume one of several possible values. For example, in this embodiment, when a user right-clicks the node on one of these input parameters an option for creating a constant is presented. Selecting this option produces a corresponding list box. Left clicking on a list box presents the user with a list of the possible values for the input parameter. Selecting one of these values determines the value of the parameter input to the node at execution time. In this example, the label "board clock" refers to a 20 MHz Timebase, the label "RTSI clock" refers to a RTSI 7 terminal, and the label "digital trigger a" refers to a digital start trigger.

FIG. 3 illustrates another example of a prior art approach to configuring timing and triggering for a device, where an E Series device acquires data once for every 10 falling edges received from an external device, as specified by a time base divisor value of 10, as shown. Thus, an input signal time base is divided by 10, then used to trigger the data acquisition. As FIG. 3 shows, in this approach, timing parameters for the device are independently specified by setting parameter values for a node, e.g., a property node, in a LabVIEW program.

In this example, an input parameter can actually be a 'cluster' which is itself made up of one or more input parameters. As shown, a Clock Configuration node in this program has such a cluster, where in this example, the four parameter cluster shown is created by right-clicking on the node and selecting the 'create constant' option. Note that no contextual information for the node is provided, and thus, the user is presumed to know and understand the operational context of the timing operation.

Although the examples described with reference to FIGS. 2–3 relate to graphical programs and/or graphical tools, e.g., LabVIEW graphical programs and configuration tools, it should be noted that in prior art approaches to configuring timing and triggering which use textual programming languages, e.g., the C programming language, the drawbacks are at least as significant, in that the user must typically determine which function calls to invoke, and which parameter values to set, in specifying timing and triggering for the hardware. In other words, the user may still need substantial knowledge regarding the behavior or design of the hardware.

As another example, when selecting connectors for importing or exporting a signal, prior art systems generally present an inclusive list of all connectors on the device, and thus a user may have to consult numerous separate documents to discover which connectors are possible or valid.

Thus, prior art techniques may provide access to the configurable attributes of a device, but do not generally include contextual information. Additionally, information on the actual configuration of the hardware must typically be explicitly queried.

Additionally, constraints imposed by the design of a device and by configuration of other attributes of the device are not generally considered or enforced by prior art approaches and systems. For example, conditional constraints, such as the fact that one property may not apply unless another property's value is above a certain level, or that signal A can be routed to terminal X as long as the source of signal A is terminal Y, may not be enforced in the configuration process.

Prior art systems also do not typically propagate effects of a configured parameter to other aspects or parameters of the device. For example, the effect of configuring a signal or delay on the operation of a device is not generally shown by prior art systems. Thus, the user is expected to know and/or predict any consequential configuration changes resulting from the user specification of a particular parameter or signal route.

Thus, improved systems and method are desired for representing and configuring hardware timing and triggering.

SUMMARY OF THE INVENTION

Various embodiments of a system and method for graphically representing and specifying hardware timing and triggering are presented. More specifically, various embodiments are described wherein a diagram is used to graphically represent and configure timing, triggering, and/or signal routing for a specified device. It should be noted that as used herein, the term "timing and triggering" may refer to both, or either, of timing and triggering. Additionally, it is contemplated that various embodiments of the method described below may be broadly applicable in representing and specifying a wide variety of hardware devices that operate to manage, route, or otherwise process communication and/or control signals. In other words, the devices contemplated include not only measurement devices, e.g., DAQ boards, but also include any other type of device that routes signals, such as timing and triggering signals, for control or communication. Note also that in various embodiments, a device may be a single card or component, or may comprise a plurality of coupled devices, e.g., a network or system of devices. Additionally, in various embodiments, the diagram may be specific to a hardware product, or a hardware product family, e.g., the E-Series family of DAQ boards from National Instruments Corporation.

A diagram may be displayed that graphically represents user-configurable timing and triggering components of a device, where timing and triggering for the device is determined by a plurality of timing and triggering attributes. The diagram preferably graphically represents operational relationships between the timing and triggering components of the device, e.g., the diagram may include a plurality of icons which represent the timing and triggering components of the device, and may also include a plurality of signal paths indicating coupling between two or more of the timing and triggering components of the device. Thus, the diagram may graphically indicate various of the components of the device, and may also indicate signal or communication paths between the components.

For example, displaying the diagram may include displaying timing and/or triggering signal routes of the device. In one embodiment, the diagram may graphically indicate a respective status of each route, e.g., whether the signal is active or inactive, imported or exported, and so forth. In one embodiment, the signal routes may use colors and/or line types to indicate the respective status of each route, where, for example, a green or solid signal path may indicate that the route is active, a red or dashed signal path may indicate that the route is active and exported, and a black or dotted signal path may indicate that the route is inactive. In other embodiments, other graphical means may be used to indicate the status of respective routes. For example, the timing and triggering signal routes may be displayed using line widths, symbols, labels, etc., to indicate the respective status of each route.

User input to the diagram may then be received specifying one or more of the timing and triggering attributes of the device. In other words, the diagram may operate to receive user input specifying values of at least one timing parameter, values of at least one triggering parameter, at least one timing signal route, and/or at least one triggering signal route. For example, specifying values may include specifying a signal source and/or a signal destination for timing and/or triggering signals.

Alternatively, or in addition, receiving user input to the diagram specifying values for the timing and triggering attributes may include receiving user input selecting a position of a switch in the diagram, receiving user input selecting a value from a list of values, receiving user input to a data field in the diagram, and/or receiving user input to an icon, among other means of data entry. In one embodiment, specifying values of one or more timing and triggering signal parameters may include specifying values of a rate, a divisor (e.g., for modifying a signal frequency or amplitude), a delay, a polarity, an impedance, a pulse or level output behavior, a window or edge trigger mode, a hysteresis, a voltage level, and/or a slope, among other parameters, such signal parameters being well known in the art. One example of receiving user input to an icon is the user selecting a state of a "signal behavior" icon, e.g., where the user clicks on a signal pulse icon to cycle through the available states, e.g., rising or falling polarity, pulse or level, active high level or active low level.

In one embodiment, the diagram may be displayed with a default configuration, where at least a subset of the timing and triggering attributes have default values, e.g., one or more of the timing and triggering attributes may be initialized with default values such that the user may not be required to specify all of the attributes, assuming that the default values are appropriate for the desired functionality of the device.

In one embodiment, prior to displaying the diagram, input may be received specifying the device, e.g., input may be provided indicating the device (or family of devices) whose diagram is to be displayed (and configured). For example, in one embodiment, displaying the diagram may be initiated from a graphical configuration utility. The user may invoke the diagram display via a menu, key-command, button, etc., and may specify which device or family of devices is to be represented by the diagram.

In one embodiment, a hardware discovery process may be performed to determine what devices are currently installed on or in the computer system. The user may then select from among the discovered devices to invoke the appropriate diagram.

In another embodiment, prior to displaying the diagram, a discovery process (or equivalent) may be performed on the device to determine a current configuration of the device. Thus, displaying the diagram graphically representing user-configurable timing and triggering components of a device may include displaying the diagram in accordance with the current configuration of the device. In other words, when the user is first presented with the diagram, the diagram may already be configured to represent the current configuration of the device.

In response to the user input specifying the attributes, the diagram may be modified in accordance with the specified timing and triggering attributes, where the diagram represents configuration of the user-configurable timing and triggering components of the device. In one embodiment, modifying the diagram in accordance with the specified timing and triggering attributes may include programmatically configuring the diagram in accordance with the user input to generate a configured diagram, where the configured diagram represents configuration of the user-configurable timing and triggering components of the device. In other words, the diagram may be automatically updated to reflect the new configuration in accordance with the received user input, i.e., in accordance with the specified timing and triggering attributes.

In one embodiment, user input specifying one attribute may result in a another attribute being automatically specified. In other words, where a second attribute is dependent upon the value of a first attribute, specification of the first attribute may result in the second attribute being set or modified automatically. For example, in one embodiment, receiving user input may include receiving user input to a first component in the diagram, e.g., specifying the first attribute, and programmatically configuring the diagram may include programmatically configuring a second component of the diagram, e.g., specifying the second attribute, based on the user input to the first component in the diagram.

For example, the user input to the first component in the diagram may be analyzed, and modifications to one or more dependent attributes of the second component may be programmatically determined based on the user input. The one or more dependent attributes may then be programmatically modified accordingly. Thus, in one embodiment, programmatically modifying the diagram in accordance with the specified one or more timing and triggering attributes may include automatically computing all of the plurality of timing and triggering attributes that are dependent on the specified one or more timing and triggering attributes.

It is noted that automatically specifying dependent attributes based on user-specification of attribute values may include cases where attributes have circular dependencies. For example, a first attribute a may be computable from values of second and third attributes, b and c, e.g., $a=b/c$, where for a given value of c, specifying b may result in automatic specification or computation of a. Similarly, for the given value of c, specifying a may result in automatic specification or computation of b. It is noted that this simple example is exemplary only, and that more complex relationships and dependencies between attribute values are also contemplated, where user specification of one set of attributes results in automatic specification of a second set of dependent attributes. Additionally, in one embodiment, when user specification of a first attribute results in automatic computation of dependent attributes, e.g., circularly dependent attributes, the value of the first attribute may be re-calculated or re-specified based on the automatically computed attributes, e.g., the attribute that initiated the automated calculation of the dependent attributes may itself be re-calculated in the process.

In one embodiment, modifying the diagram in accordance with the specified attributes includes modifying the diagram in accordance with the specified attributes only if the specified attributes are valid, thereby maintaining a valid state of the configuration of the device, e.g., the method may include programmatically performing various checks and analyses to determine whether a user specified attribute is valid, and may only set or implement the user specified attribute value if the specified attribute is determined to be valid. In one embodiment, the method may graphically indicate to the user when a specified attribute is invalid, e.g., by displaying a popup dialog or message, by symbolically indicating the invalidity, etc.

The specified one or more timing and triggering attributes may then be stored, e.g., in a memory medium, where the one or more timing and triggering attributes are usable to configure timing and triggering for the device. The stored attributes may also include default values for at least a subset of the timing and triggering values for the device, e.g., all of the attributes needed to configure the device may be stored, e.g., and used to configure the specified device, exported to other systems, etc.

In one embodiment, program code may be generated based on the diagram, where the program code is executable to configure timing and triggering for the device. For example, in various embodiments, the program code may include textual program code, e.g., C, C++, Java, etc., and/or may include graphical program code. For example, in one embodiment, the graphical program code may include a data flow graphical program, such as a LabVIEW data flow graphical program. In other embodiments, the graphical program code may include a control flow diagram, an event flow diagram, or any other type of graphical flow diagram as desired, where the graphical flow diagram is executable and/or interpretable to configure the device.

In one embodiment, the method may include configuring timing and triggering for the device using the specified one or more timing and triggering attributes. For example, the user may select an "apply" or "configure" button or menu item, or functional equivalent, thereby invoking or initiating a configuration process for the device, wherein the device is configured in accordance with the timing and triggering attributes specified in or by the diagram, including any default values of attributes.

In one embodiment, a state diagram may also be displayed, where the state diagram indicates effects of said modifying the diagram upon operation of the device. In other words, the state diagram may reflect the operations of the device in accordance with the device configuration represented by the diagram. In one embodiment, the state diagram may correspond to a state machine, e.g., implemented in software as a program or data structure, where the state machine represents operation of the device. For example, in a case where a signal delay has been specified for a trigger signal, the state diagram may include a state icon or node representing the delay state for the signal. Thus, user specified attributes or configurations of the diagram may automatically result in corresponding updates of the state diagram. As described above with respect to the diagram, in various embodiments, paths between state nodes in the state diagram may be represented graphically, e.g., using color, line widths or styles, etc. For example, in one embodiment, a green or solid path may denote a transistor-transistor logic (TTL) input signal, a red or dashed path may denote an active TTL output (export) signal, a blue or dot-dash path may denote a software command, and a black or dotted path may indicate that the state machine makes the transition or that a TTL output is inactive. In other embodiments, the different path types may be represented using line widths, symbols, labels, etc.

In one embodiment, the user may make modifications to the state diagram which result in corresponding modifications to the diagram. For example, user input to the state diagram may be received modifying a configuration of the state diagram, thereby generating a modified state diagram. The diagram may then be programmatically modified in accordance with the modified state diagram. Thus, the diagram and the state diagram may each invoke updates upon the other in accordance with received user input.

BRIEF DESCRIPTION OF THE DRAWINGS

A better understanding of the present invention can be obtained when the following detailed description of the preferred embodiment is considered in conjunction with the following drawings, in which.

Figure 1:
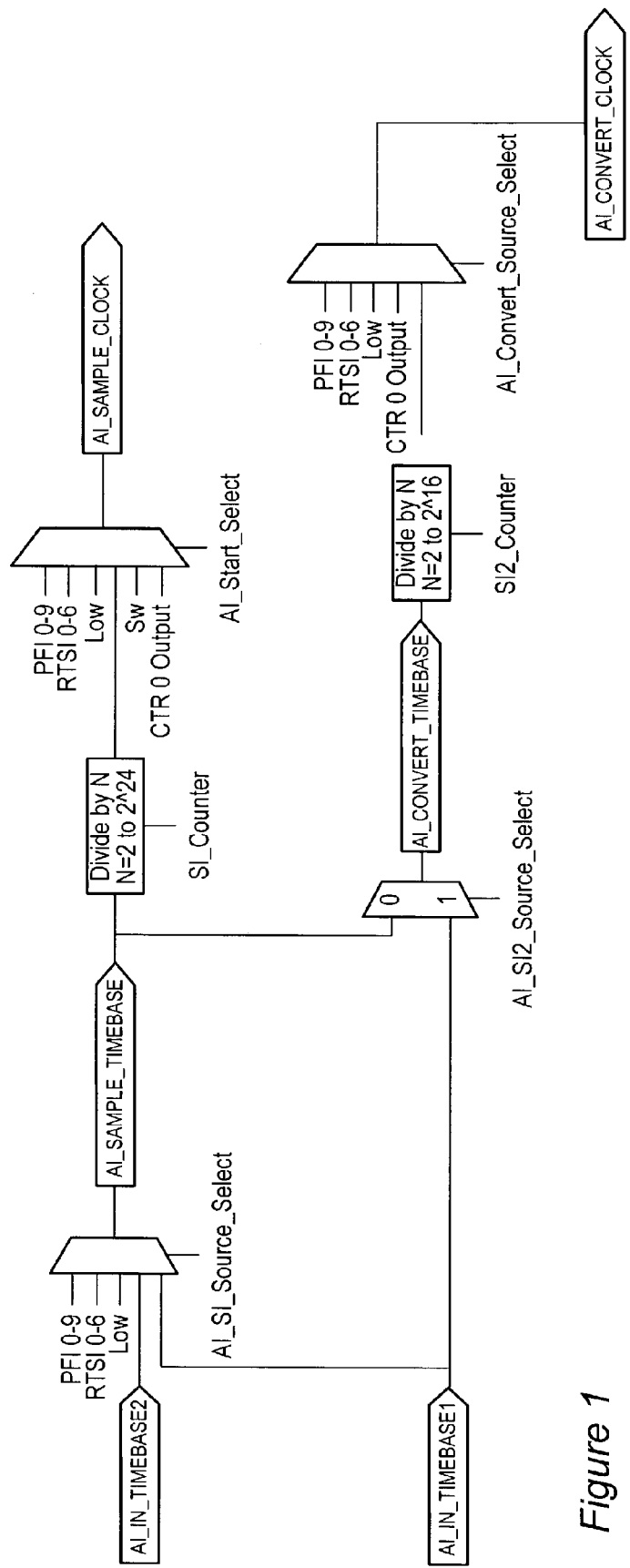
FIG. 1 illustrates an exemplary data acquisition device, specifically, an E-Series DAQ card from National Instruments, according to one embodiment.
Figure 2:
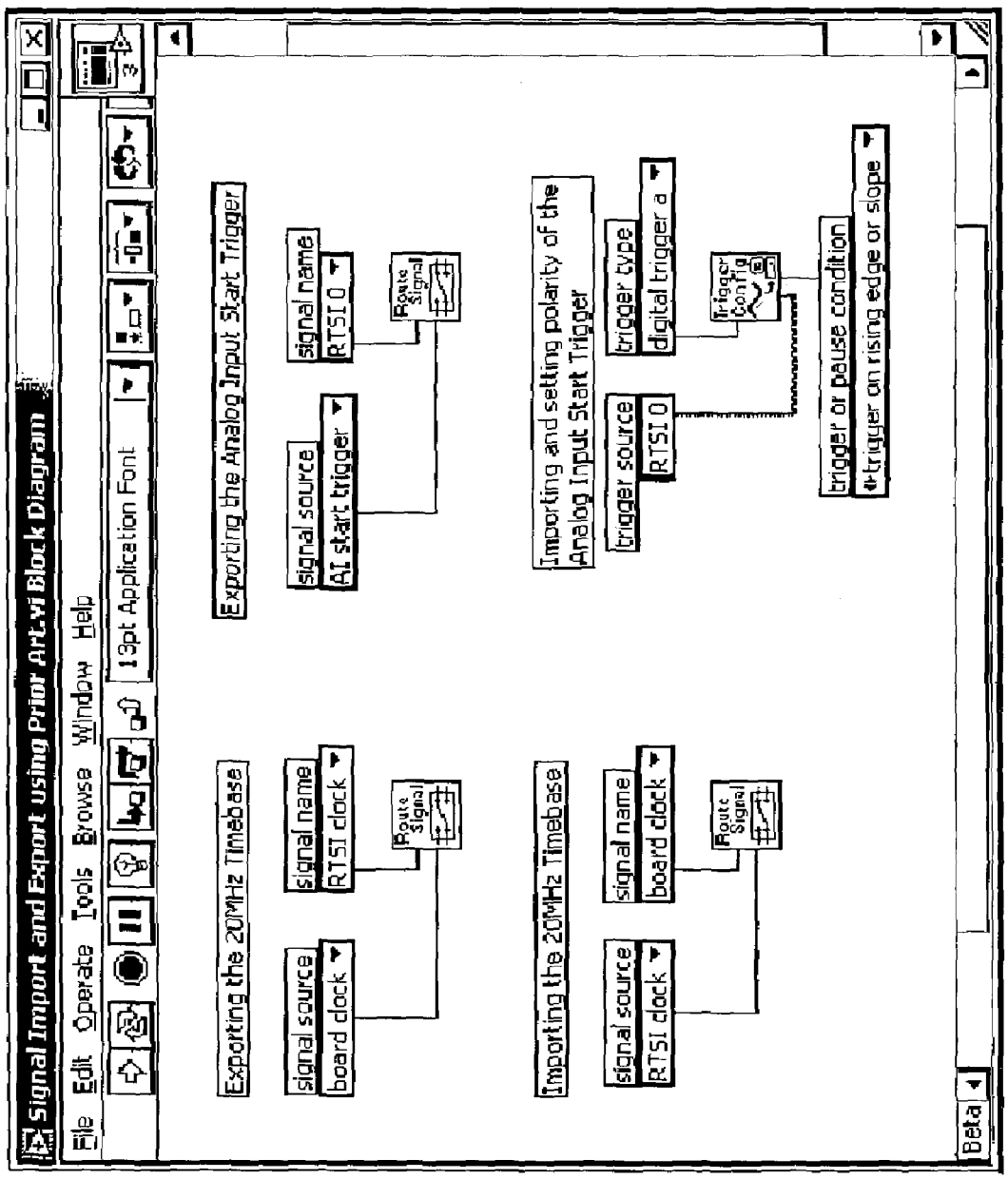
FIG. 2 illustrates configuration of timing and triggering for a device, according to the prior art.
Figure 3:
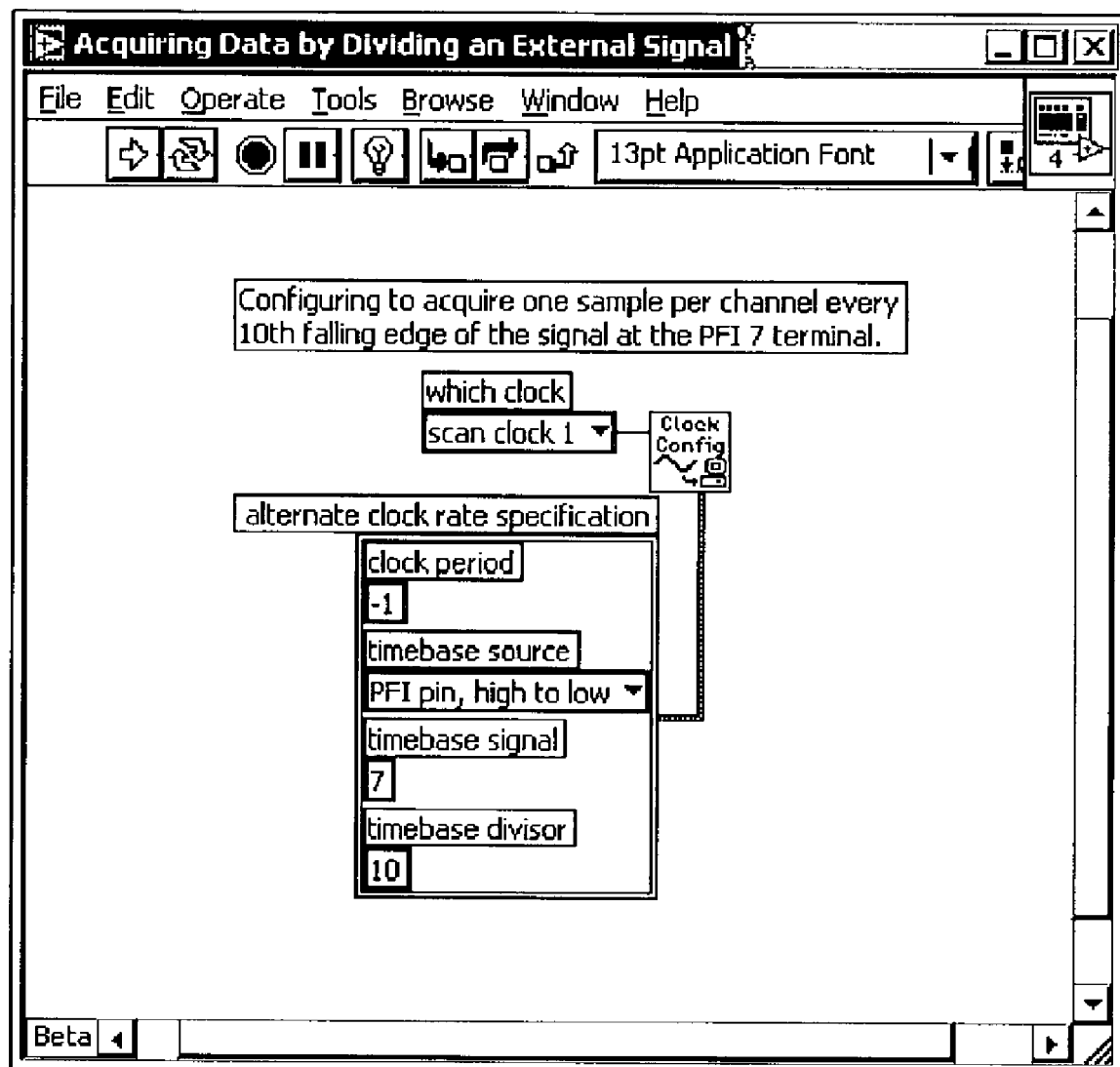
FIG. 3 illustrates configuration of timing for a device, according to the prior art.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Incorporation by Reference

The following references are hereby incorporated by reference in their entirety as though fully and completely set forth herein:

U.S. Pat. No. 4,914,568 titled "Graphical System for Modeling a Process and Associated Method," issued on Apr. 3, 1990.

U.S. Pat. No. 5,481,741 titled "Method and Apparatus for Providing Attribute Nodes in a Graphical Data Flow Environment".

U.S. Pat. No. 6,173,438 titled "Embedded Graphical Programming System" filed Aug. 18, 1997.

U.S. Pat. No. 6,219,628 titled "System and Method for Configuring an Instrument to Perform Measurement Functions Utilizing Conversion of Graphical Programs into Hardware Implementations," filed Aug. 18, 1997.

U.S. patent application Ser. No. 09/617,600 titled "Graphical Programming System with Distributed Block Diagram Execution and Front Panel Display," filed Jun. 13, 2000.

U.S. patent application Ser. No. 09/518,492 titled "System and Method for Programmatically Creating a Graphical Program," filed Mar. 3, 2000.

U.S. patent application Ser. No. 09/745,023 titled "System and Method for Programmatically Generating a Graphical Program in Response to Program Information," filed Dec. 20, 2000.

The LabVIEW and BridgeVIEW graphical programming manuals, including the "G Programming Reference Manual", available from National Instruments Corporation, are also hereby incorporated by reference in their entirety.

Figure 4:
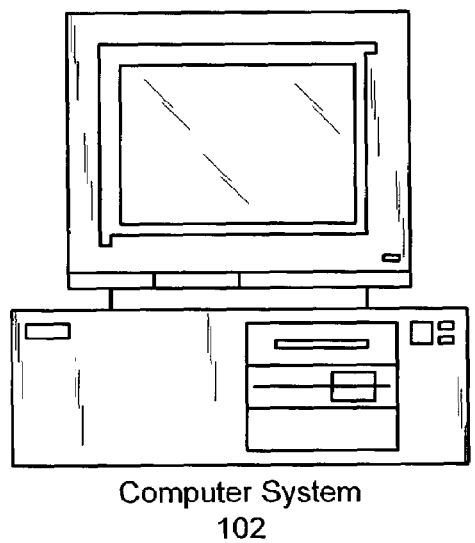
FIG. 4 illustrates an exemplary computer system operable to implement various embodiments of the present invention.

FIG. 4—Computer System

FIG. 4 illustrates a computer system 102 operable to implement various embodiments of the present invention. The computer system 102 may be any type of computer system, including a personal computer system, mainframe computer system, workstation, network appliance, Internet appliance, personal digital assistant (PDA), television system or other device. In general, the term "computer system" can be broadly defined to encompass any device having at least one processor that executes instructions from a memory medium.

As shown in FIG. 4, the computer system 102 may include a display device operable to display a schematic configuration diagram for representing and/or specifying timing and triggering for a hardware device, such as a DAQ card, as described in detail below. The display device may also be operable to display a graphical user interface for invoking or modifying the schematic configuration diagram. The graphical user interface may comprise any type of graphical user interface, e.g., depending on the computing platform.

The computer system 102 may include a memory medium(s) on which one or more computer programs or software components according to one embodiment of the present invention may be stored. For example, the memory medium may store one or more graphical programs which are executable to perform the methods and/or implement the systems described herein. Also, the memory medium may store a graphical programming development environment application used to create and/or execute such graphical programs. The memory medium may also store operating system software, as well as other software for operation of the computer system.

The term "memory medium" is intended to include an installation medium, e.g., a CD-ROM, floppy disks 104, or tape device; a computer system memory or random access memory such as DRAM, SRAM, EDO RAM, Rambus RAM, etc.; or a non-volatile memory such as a magnetic media, e.g., a hard drive, or optical storage. The memory medium may comprise other types of memory as well, or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. An example of such a networked computer system is provided below with reference to FIG. 5.

Various embodiments further include receiving or storing instructions and/or data implemented in accordance with the foregoing description upon a carrier medium. Suitable carrier media include a memory medium as described above, as well as signals such as electrical, electromagnetic, or digital signals, conveyed via a communication medium such as networks and/or a wireless link.

In the present application, the term "graphical program" or "block diagram" is intended to include a program comprising graphical code, e.g., two or more interconnected nodes or icons, wherein the interconnected nodes or icons may visually indicate the functionality of the program. For example, the nodes or icons may be connected by links or wires indicating connectivity between program components, e.g., for communication, control, etc. The nodes may be connected in one or more of a data flow, control flow, and/or execution flow format. The nodes may also be connected in a "signal flow" format, which is a subset of data flow. Thus the terms "graphical program" or "block diagram" are each intended to include a program comprising a plurality of interconnected nodes or icons which visually indicate the functionality of the program. As used herein, the terms "data flow diagram" or "data flow graphical program" refer to a graphical program where the links or wires indicate that data produced by one node is used by another node.

A graphical program may also comprise a user interface or front panel. The user interface portion may be contained in the block diagram or may be contained in one or more separate panels or windows. The user interface of a graphical program may include various graphical user interface elements or front panel objects, such as user interface controls and/or indicators, that represent or display the respective input and/or output that will be used by the graphical program or VI, and may include other icons which represent devices being controlled. The user interface or front panel may be comprised in a single window of user interface elements, or may comprise a plurality of individual windows each having one or more user interface elements, wherein the individual windows may optionally be tiled together. As another example, the user interface or front panel may comprise user interface or front panel objects, e.g., the GUI, embedded in the block diagram. The user interface of a graphical program may display only output, only input, or both input and output. Further, in some embodiments the user interface or front panel of a graphical program may enable the user to interactively control or manipulate the input being provided to the graphical program.

Examples of graphical programming development environments that may be used to create graphical programs include LabVIEW, DasyLab, and DiaDem from National Instruments, VEE from Agilent, WiT from Coreco, Vision Program Manager from PPT Vision, SoftWIRE from Measurement Computing, Simulink from the MathWorks, Sanscript from Northwoods Software, Khoros from Khoral Research, SnapMaster from HEM Data, VisSim from Visual Solutions, ObjectBench by SES (Scientific and Engineering Software), and VisiDAQ from Advantech, among others. In the preferred embodiment, the system uses the LabVIEW graphical programming system available from National Instruments.

Figure 5:
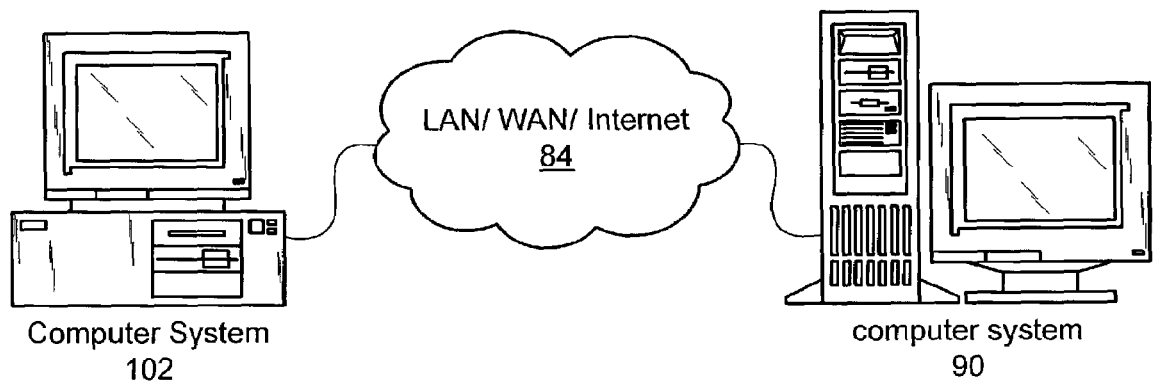
FIG. 5 illustrates an exemplary networked computer system operable to implement various embodiments of the present invention.

FIG. 5—A Networked Computer System

It should be noted that various embodiments are also contemplated wherein the functionality of the systems and methods described herein is distributed across multiple computers. FIG. 5 illustrates an exemplary networked computer system, where a first computer, e.g., computer system 102, is coupled to a second computer 90, e.g., a server computer 90. In one embodiment, some or all of the program instructions implementing the present invention may execute on the first computer system 102, and graphical displays resulting from or associated with the program execution may be displayed on a display device of the second computer system 90, where the second computer system 90 is connected through a network (or a computer bus) 84 to the first computer system, as shown. It is noted that the network can be any of various types, including a LAN (local area network), WAN (wide area network), the Internet, or an Intranet, among others. As another example, the second computer system may present a graphical user interface on the display device of the second computer system and, in response to receiving user input to the graphical user interface, the user input may be provided to the program executing on the first computer system. The above-incorporated patent application titled "Graphical Programming System with Distributed Block Diagram Execution and Front Panel Display" describes one embodiment of a method enabling graphical program execution and GUI display of the graphical program output to be distributed across multiple computer systems. Of course, other ways of distributing implementation of embodiments of the present invention are also contemplated.

In another embodiment, at least a portion of the program instructions implementing the invention may be executed on a reconfigurable instrument connected to the computer system 102. The reconfigurable instrument may include configurable logic, such as a programmable logic device (PLD), e.g., an FPGA, or a processor and memory, which may execute a real time operating system. In one embodiment, an application development environment with which the program, e.g., the graphical program, is associated may provide support for downloading a graphical program for execution on configurable logic in a real time system.

Figure 6A:
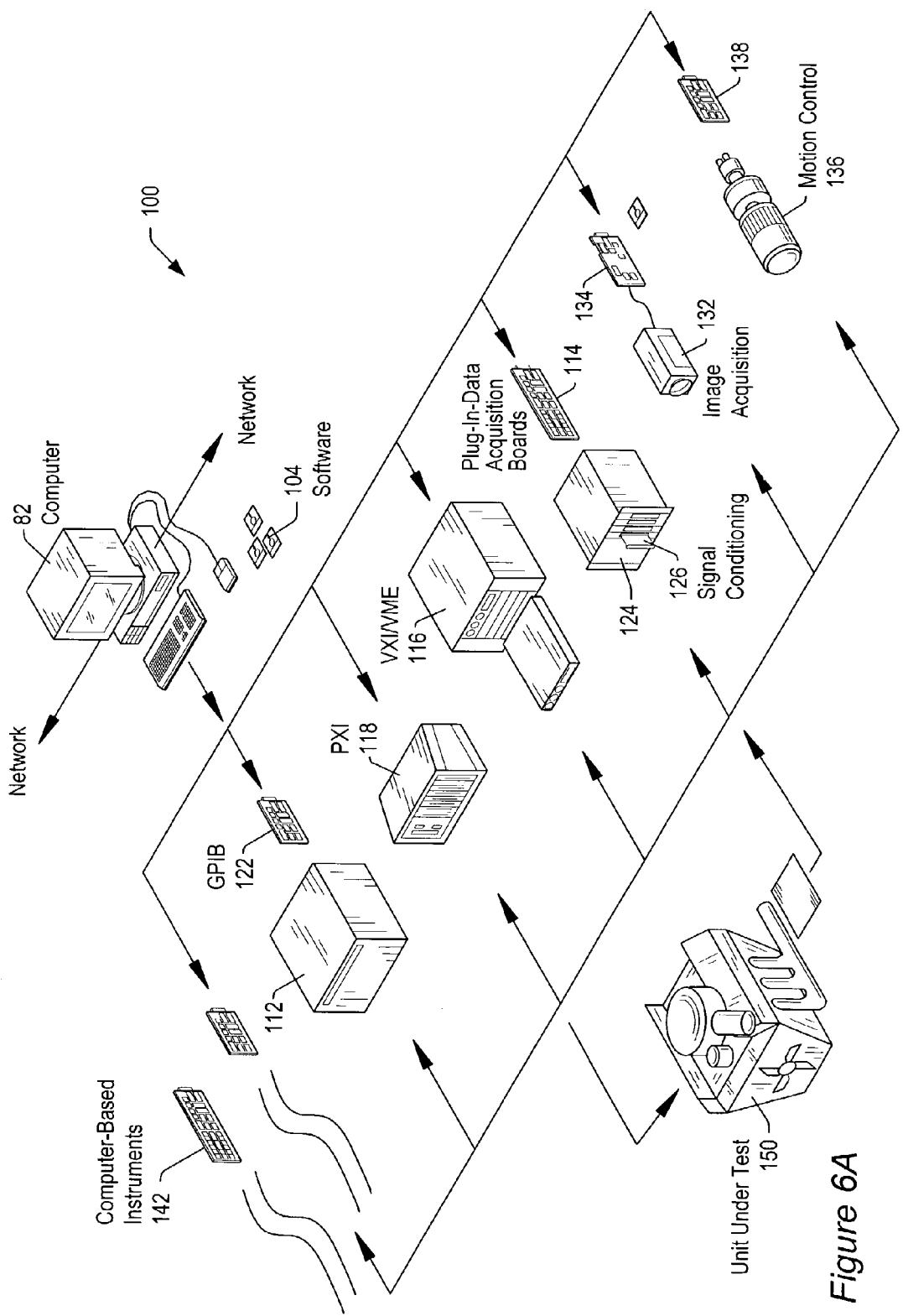
FIG. 6A illustrates an instrumentation control system according to one embodiment of the invention.
Figure 6B:
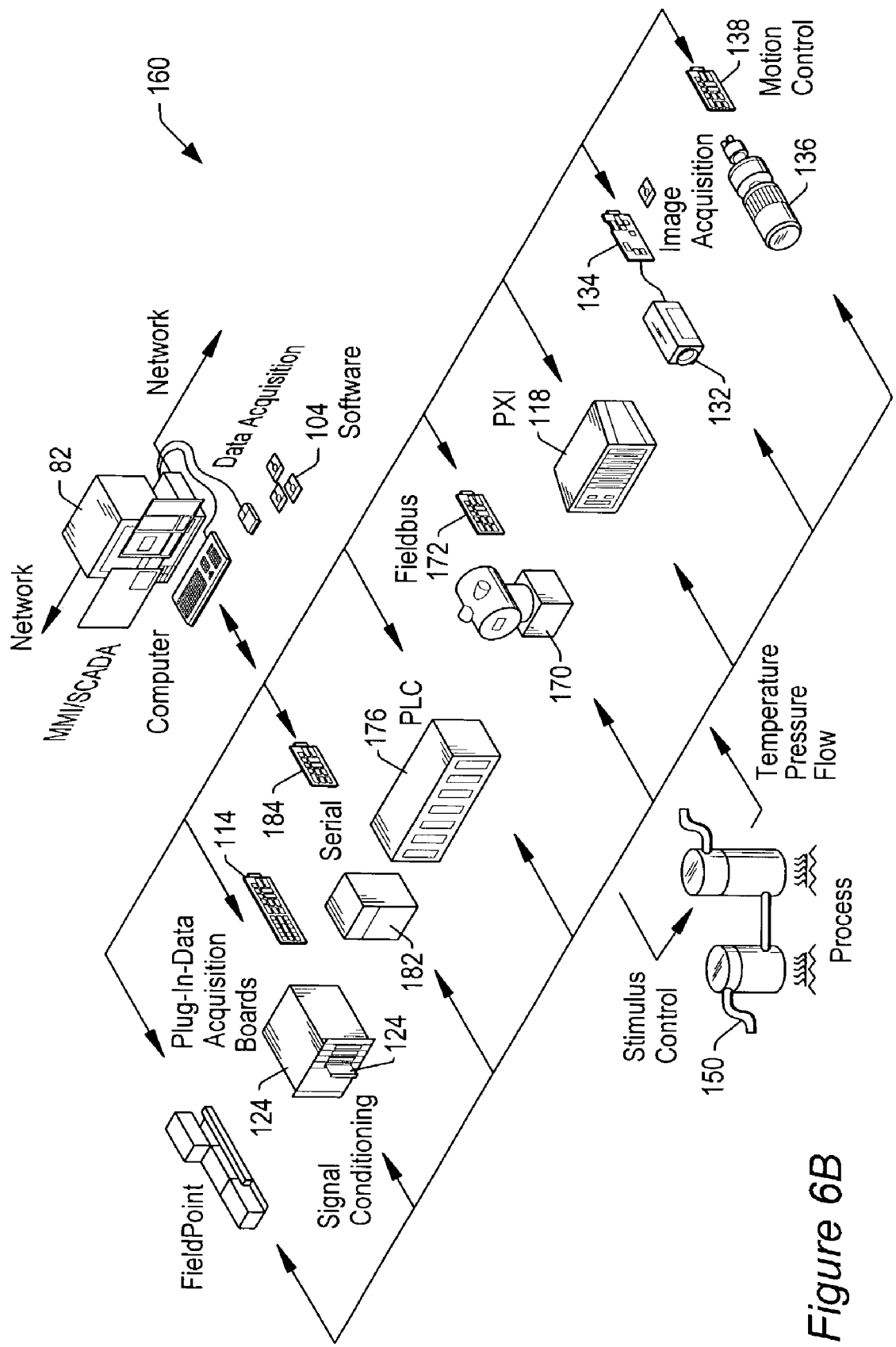
FIG. 6B illustrates an industrial automation system according to one embodiment of the invention.

FIGS. 6A and 6B—Instrumentation and Industrial Automation Systems

The following describes embodiments of the present invention involved with performing test and/or measurement functions and/or controlling and/or modeling instrumentation or industrial automation hardware. However, it is noted that the present invention can be used for a plethora of applications and are not limited to instrumentation or industrial automation applications. In other words, the following description is exemplary only, and the present invention may be used in any of various types of systems. Thus, the system and method of the present invention is operable to be used in any of various types of applications, including the control of other types of devices such as multimedia devices, video devices, audio devices, telephony devices, Internet devices, etc., as well as general purpose software applications such as word processing, spreadsheets, network control, games, etc.

FIG. 6A illustrates an exemplary instrumentation control system 100 which may implement embodiments of the invention. The system 100 comprises a host computer 102 which connects to one or more instruments. The host computer 102 may comprise a CPU, a display screen, memory, and one or more input devices such as a mouse or keyboard as shown. The computer 102 may operate with the one or more instruments to analyze, measure or control a unit under test (UUT) or process 150.

The one or more instruments may include a GPIB instrument 112 and associated GPIB interface card 122, a data acquisition board 114 and associated signal conditioning circuitry 124, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices.

The GPIB instrument 112 may be coupled to the computer 102 via the GPIB interface card 122 provided by the computer 102. In a similar manner, the video device 132 may be coupled to the computer 102 via the image acquisition card 134, and the motion control device 136 may be coupled to the computer 102 through the motion control interface card 138. The data acquisition board 114 may be coupled to the computer 102, and may interface through signal conditioning circuitry 124 to the UUT. The signal conditioning circuitry 124 may comprise an SCXI (Signal Conditioning eXtensions for Instrumentation) chassis comprising one or more SCXI modules 126.

The GPIB card 122, the image acquisition card 134, the motion control interface card 138, and the DAQ card 114 are typically plugged in to an I/O slot in the computer 102, such as a PCI bus slot, a PC Card slot, or an ISA, EISA or MicroChannel bus slot provided by the computer 102. However, these cards 122, 134, 138 and 114 are shown external to computer 102 for illustrative purposes. These devices may also be connected to the computer 102 through a serial bus or through other means.

The VXI chassis or instrument 116 may be coupled to the computer 102 via a VXI bus, MXI bus, or other serial or parallel bus provided by the computer 102. The computer 102 may include VXI interface logic, such as a VXI, MxI or GPIB interface card (not shown), which interfaces to the VXI chassis 116. The PXI chassis or instrument may be coupled to the computer 102 through the computer's PCI bus.

A serial instrument (not shown) may also be coupled to the computer 102 through a serial port, such as an RS-232 port, USB (Universal Serial bus) or IEEE 1394 or 1394.2 bus, provided by the computer 102. In typical instrumentation control systems an instrument will not be present of each interface type, and in fact many systems may only have one or more instruments of a single interface type, such as only GPIB instruments.

The instruments may be coupled to a unit under test (UUT) or process 150, or may be coupled to receive field signals, typically generated by transducers. The system 100 may be used in a data acquisition and control application, in a test and measurement application, an image processing or machine vision application, a process control application, a man-machine interface application, a simulation application, or a hardware-in-the-loop validation application.

FIG. 6B illustrates an exemplary industrial automation system 160 which may implement embodiments of the invention. The industrial automation system 160 is similar to the instrumentation or test and measurement system 100 shown in FIG. 6A. Elements which are similar or identical to elements in FIG. 6A have the same reference numerals for convenience. The system 160 may comprise a computer 102 which connects to one or more devices or instruments. The computer 102 may comprise a CPU, a display screen, memory, and one or more input devices such as a mouse or keyboard as shown. The computer 102 may operate with the one or more devices to a process or device 150 to perform an automation function, such as MMI (Man Machine Interface), SCADA (Supervisory Control and Data Acquisition), portable or distributed data acquisition, process control, advanced analysis, or other control.

The one or more devices may include a data acquisition board 114 and associated signal conditioning circuitry 124, a PXI instrument 118, a video device 132 and associated image acquisition card 134, a motion control device 136 and associated motion control interface card 138, a fieldbus device 170 and associated fieldbus interface card 172, a PLC (Programmable Logic Controller) 176, a serial instrument 182 and associated serial interface card 184, or a distributed data acquisition system, such as the Fieldpoint system available from National Instruments, among other types of devices.

The DAQ card 114, the PXI chassis 118, the video device 132, and the image acquisition card 134 may be connected to the computer 102 as described above. The serial instrument 182 may be coupled to the computer 102 through a serial interface card 184, or through a serial port, such as an RS-232 port, provided by the computer 102. The PLC 176 may couple to the computer 102 through a serial port, Ethernet port, or a proprietary interface. The fieldbus interface card 172 may be comprised in the computer 102 and may interface through a fieldbus network to one or more fieldbus devices. Each of the DAQ card 114, the serial card 184, the fieldbus card 172, the image acquisition card 134, and the motion control card 138 are typically plugged in to an I/O slot in the computer 102 as described above. However, these cards 114, 184, 172, 134, and 138 are shown external to computer 102 for illustrative purposes. In typical industrial automation systems a device will not be present of each interface type, and in fact many systems may only have one or more devices of a single interface type, such as only PLCs. The devices may be coupled to the device or process 150.

As used herein, the term "instrument" is intended to include any of the devices that are adapted to be connected to a computer system as shown in FIGS. 6A and 6B, traditional "stand-alone" instruments, as well as other types of measurement and control devices. The term "measurement function" may include any type of data acquisition, measurement or control function, such as that implemented by the instruments shown in FIGS. 6A and 6B. For example, the term "measurement function" includes acquisition and/or processing of an image. As described below, a graphical program may be created that implements a measurement function. For example, the graphical program may be used to acquire a signal and perform the measurement function on the acquired signal.

In the embodiments of FIGS. 6A and 6B above, one or more of the various instruments may couple to the computer 102 over a network, such as the Internet. In one embodiment, the user operates to select a target instrument or device from a plurality of possible target devices for programming or configuration according to the present invention. Thus the user may create or deploy a graphical program on a computer and use the graphical program in conjunction with a target device or instrument that is remotely located from the computer and coupled to the computer through a network.

Graphical software programs which perform data acquisition, analysis and/or presentation, e.g., for measurement, instrumentation control, industrial automation, or simulation, such as in the applications shown in FIGS. 6A and 6B, may be referred to as virtual instruments.

Figure 7:
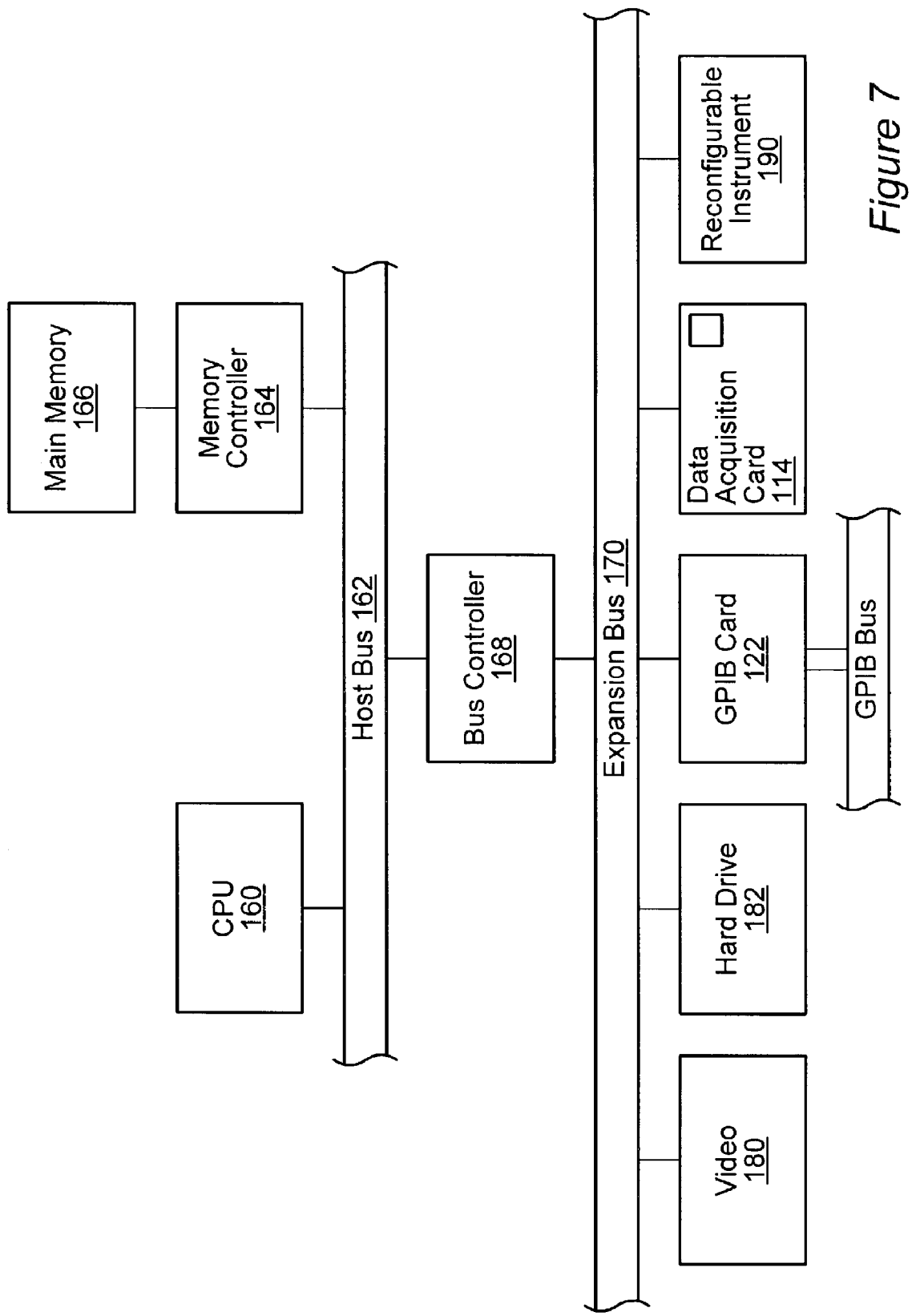
FIG. 7 is an exemplary block diagram of the computer systems of FIGS. 4, 5, 6A, and 6B.

FIG. 7—Computer System Block Diagram

FIG. 7 is a block diagram representing one embodiment of the computer system 102 illustrated in FIGS. 4, 5, 6A, and 6B. It is noted that any type of computer system configuration or architecture can be used as desired, and FIG. 7 illustrates a representative PC embodiment. It is also noted that the computer system may be a general purpose computer system, a computer implemented on a VXI card installed in a VxI chassis, a computer implemented on a PXI card installed in a PXI chassis, or other types of embodiments. Elements of a computer not necessary to understand the present description have been omitted for simplicity.

The computer may include at least one central processing unit or CPU 160 which is coupled to a processor or host bus 162. The CPU 160 may be any of various types, including an x86 processor, e.g., a Pentium class, a PowerPC processor, a CPU from the SPARC family of RISC processors, as well as others. Main memory 166 is coupled to the host bus 162 by means of memory controller 164. The main memory 166 may store program instructions implementing various embodiments of the present invention. The main memory may also store operating system software, as well as other software for operation of the computer system.

The host bus 162 may be coupled to an expansion or input/output bus 170 by means of a bus controller 168 or bus bridge logic. The expansion bus 170 may be the PCI (Peripheral Component Interconnect) expansion bus, although other bus types can be used. The expansion bus 170 includes slots for various devices such as a data acquisition board 114 and a GPIB interface card 122 which provides a GPIB bus interface to a GPIB instrument. The computer 102 further comprises a video display subsystem 180 and hard drive 182 coupled to the expansion bus 170.

As shown, a reconfigurable instrument 190 may also be connected to the computer. The reconfigurable instrument 190 may include configurable logic, such as a programmable logic device, e.g., an FPGA, or a processor and memory, which may execute a real time operating system. According to one embodiment, at least a portion of the invention may be implemented using a graphical program. Thus, a graphical programming development environment with which the graphical program is associated may provide support for configuring the reconfigurable instrument 190 to execute at least a portion of the graphical program. In various embodiments, the configurable logic may be comprised on an instrument or device connected to the computer through means other than an expansion slot, e.g., the instrument or device may be connected via an IEEE 1394 bus, USB, or other type of port, or may be connected via a network. Also, the configurable logic may be comprised on a device such as the data acquisition board 114 or another device shown in FIG. 6A or 6B.

Figure 8:
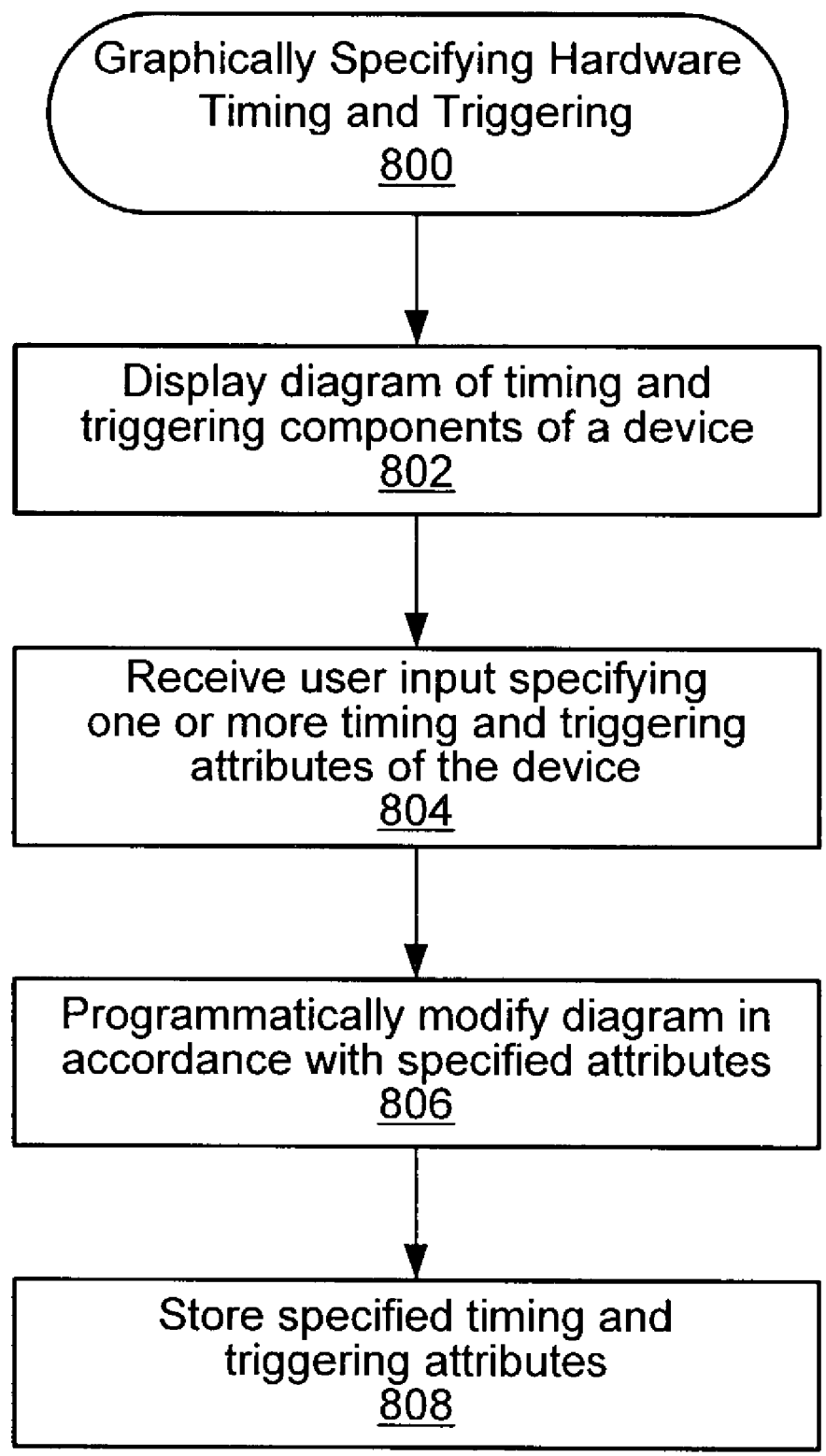
FIG. 8 is a flowchart diagram illustrating one embodiment of a method for graphically representing and specifying hardware timing and triggering, according to one embodiment.

FIG. 8—Method for Specifying Timing and Triggering for Devices

FIG. 8 is a flowchart diagram of one embodiment of a method for representing and specifying timing and triggering for hardware devices. It should be noted that as used herein, the term "timing and triggering" may refer to both, or either, of timing and triggering. Additionally, it is contemplated that various embodiments of the method described below may be broadly applicable in representing and specifying a wide variety of hardware devices that operate to manage, route, or otherwise process communication and/or control signals. In other words, the devices contemplated include not only measurement devices, e.g., DAQ boards, but also include any other type of device that routes signals, such as timing and triggering signals, for control or communication. As noted above, in various embodiments, a device may be a single card or component, or may comprise a plurality of coupled devices, e.g., a network or system of devices. Additionally, in various embodiments, the diagram may be specific to a hardware product, or a hardware product family, e.g., the E-Series family of DAQ boards from National Instruments Corporation. It should be noted that in various embodiments, some of the steps described below may be performed concurrently, in a different order than shown, or omitted. Additional steps may also be performed as desired.

As FIG. 8 shows, in 802, a diagram may be displayed that graphically represents user-configurable timing and triggering components of a device, where timing and triggering for the device is determined by a plurality of timing and triggering attributes. In a preferred embodiment, the diagram graphically represents operational relationships between the timing and triggering components of the device, e.g., the diagram may include a plurality of icons which represent the timing and triggering components of the device, and may also include a plurality of signal paths indicating coupling between two or more of the timing and triggering components of the device. Thus, the diagram may graphically indicate various of the components of the device, and may also indicate signal or communication paths between the components.

For example, displaying the diagram may include displaying timing and/or triggering signal routes of the device. In one embodiment, the diagram may graphically indicate a respective status of each route, e.g., whether the respective signal route is active or inactive, whether the signal is imported or exported, and so forth. In one embodiment, the signal routes may use colors to indicate the respective status of each route, where, for example, a green signal path may indicate that the route is active, a red signal path may indicate that the route is active and exported, and a black signal path may indicate that the route is inactive. In other embodiments, other graphical means may be used to indicate the status of respective routes. For example, the timing and triggering signal routes may be displayed using line types, e.g., dotted or dashed lines, line widths, symbols, labels, etc., to indicate the respective status of each route. For example, a solid signal path may indicate that the route is active, a dashed signal path may indicate that the route is active and exported, and a dotted signal path may indicate that the route is inactive.

Then, in 804, user input to the diagram may be received specifying one or more of the timing and triggering attributes of the device. In other words, the diagram may operate to receive user input indicating or specifying one or more of: values of at least one timing parameter, values of at least one triggering parameter, at least one timing signal route, and at least one triggering signal route. For example, specifying values for one or more of the timing and triggering attributes of the device may include specifying a timing signal source and/or a timing signal destination. Similarly, specifying at least one triggering signal route may include specifying a triggering signal source and/or a triggering signal destination.

Alternatively, or in addition, receiving user input to the diagram specifying values for one or more of the timing and triggering attributes of the device may include receiving user input selecting a position of a switch in the diagram, receiving user input selecting a value from a list of values, receiving user input to a data field in the diagram, and/or receiving user input to an icon, among other means of data entry. In one embodiment, specifying values of one or more timing and triggering signal parameters may include specifying values of a rate, a divisor (e.g., for modifying a signal frequency or amplitude), a delay, a polarity, an impedance, a pulse or level output behavior, a window or edge trigger mode, a hysteresis, a voltage level, and/or a slope, among other parameters, such signal parameters being well known in the art. One example of receiving user input to an icon is the user selecting a state of a "signal behavior" icon, e.g., where the user clicks on a signal pulse icon to cycle through the available states, e.g., rising or falling polarity, pulse or level, active high level or active low level. Various examples of diagrams for representing and specifying timing and triggering for devices are described below with reference to FIGS. 9A–17.

In one embodiment, the diagram may be displayed with a default configuration, where at least a subset of the timing and triggering attributes have default values. In other words, one or more of the timing and triggering attributes may be initialized with default values such that the user may not be required to specify all of the attributes, assuming that the default values are appropriate for the desired functionality of the device.

In one embodiment, prior to displaying the diagram, input may be received specifying the device. In other words, input may be provided indicating the device (or family of devices) whose diagram is to be displayed (and configured). For example, in one embodiment, the displaying of the diagram may be initiated from a graphical configuration utility. The user may invoke the diagram display via a menu, key-command, button, etc., and may specify which device or family of devices is to be represented by the diagram. Said another way, the diagram may be selected and displayed based on the user-specified hardware product or product family. In one embodiment, a hardware discovery process may be performed to determine what devices are currently installed on or in the computer system. The user may then select from among the discovered devices to invoke the appropriate diagram.

In another embodiment, prior to displaying the diagram, a discovery process (or equivalent) may be performed on the device to determine a current configuration of the device. Thus, displaying the diagram graphically representing user-configurable timing and triggering components of a device may include displaying the diagram in accordance with the current configuration of the device. In other words, when the user is first presented with the diagram, the diagram may already be configured to represent the current configuration of the device.

In response to the user input, in 806, the diagram may be modified in accordance with the specified timing and triggering attributes, where the diagram represents configuration of the user-configurable timing and triggering components of the device. In one embodiment, modifying the diagram in accordance with the specified timing and triggering attributes may include programmatically configuring the diagram in accordance with the user input to generate a configured diagram, where the configured diagram represents configuration of the user-configurable timing and triggering components of the device. In other words, the diagram may be automatically updated to reflect the new configuration in accordance with the received user input, i.e., in accordance with the specified timing and triggering attributes.

In one embodiment, user input specifying one attribute may result in a another attribute being automatically specified. In other words, where a second attribute is dependent upon the value of a first attribute, specification of the first attribute may result in the second attribute being set or modified automatically. For example, in one embodiment, receiving user input in 804 above may include receiving user input to a first component in the diagram, e.g., specifying the first attribute, and programmatically configuring the diagram may include programmatically configuring a second component of the diagram, e.g., specifying the second attribute, based on the user input to the first component in the diagram.

For example, the user input to the first component in the diagram may be analyzed, and modifications to one or more dependent attributes of the second component may be programmatically determined based on the user input. The one or more dependent attributes may then be programmatically modified accordingly. Thus, in one embodiment, programmatically modifying the diagram in accordance with the specified one or more timing and triggering attributes may include automatically computing all of the plurality of timing and triggering attributes that are dependent on the specified one or more timing and triggering attributes.

It is noted that automatically specifying dependent attributes based on user-specification of attribute values may include cases where attributes have circular dependencies. For example, a first attribute a may be computable from values of second and third attributes, b and c, e.g., a=b/c, where for a given value of c, specifying b may result in automatic specification or computation of a. Similarly, for the given value of c, specifying a may result in automatic specification or computation of b. It is noted that this simple example is exemplary only, and that more complex relationships and dependencies between attribute values are also contemplated, where user specification of one set of attributes results in automatic specification of a second set of dependent attributes. Additionally, in one embodiment, when user specification of a first attribute results in automatic computation of dependent attributes, e.g., circularly dependent attributes, the value of the first attribute may be re-calculated or re-specified based on the automatically computed attributes. In other words, the attribute that initiated the automated calculation of the dependent attributes may itself be re-calculated in the process.

In one embodiment, modifying the diagram in accordance with the specified one or more timing and triggering attributes includes modifying the diagram in accordance with the specified one or more timing and triggering attributes only if the specified one or more timing and triggering attributes are valid, thereby maintaining a valid state of the configuration of the device. In other words, in one embodiment, the method may include programmatically performing various checks and analyses to determine whether a user specified attribute is valid, and may only set or implement the user specified attribute value if the specified attribute is determined to be valid. In one embodiment, the method may graphically indicate to the user when a specified attribute is invalid, e.g., by displaying a popup dialog or message, by symbolically indicating the invalidity, etc.

Finally, in 808, the specified one or more timing and triggering attributes may be stored, e.g., in a memory medium, where the one or more timing and triggering attributes are usable to configure timing and triggering for the device. In a preferred embodiment, the specified one or more timing and triggering attributes stored may also include default values for at least a subset of the timing and triggering values for the device. In other words, all of the attributes needed to configure the device may be stored, e.g., and used to configure the specified device, exported to other systems, etc.

In another embodiment, program code may be generated based on the diagram, wherein the program code is executable to configure timing and triggering for the device. For example, in various embodiments, the program code may include textual program code, e.g., C, C++, Java, etc., and/or may include graphical program code. For example, in one embodiment, the graphical program code may include a data flow graphical program, such as a LabVIEW data flow graphical program. In other embodiments, the graphical program code may include a control flow diagram, an event flow diagram, or any other type of graphical flow diagram, as desired, where the graphical flow diagram is executable and/or interpretable to configure the device.

In one embodiment, the method may include configuring timing and triggering for the device using the specified one or more timing and triggering attributes. For example, the user may select an "apply" or "configure" button or menu item, or functional equivalent, thereby invoking or initiating a configuration process for the device, wherein the device is configured in accordance with the timing and triggering attributes specified in or by the diagram, including any default values of attributes.

In one embodiment, a state diagram may also be displayed, where the state diagram indicates effects of modifying the diagram upon operation of the device. In other words, the state diagram may reflect the operations of the device in accordance with the device configuration represented by the diagram. In one embodiment, the state diagram may correspond to a state machine, e.g., implemented in software as a program or data structure, where the state machine represents operation of the device. For example, in a case where a signal delay has been specified for a trigger signal, the state diagram may include a state icon or node representing the delay state for the signal. Thus, user specified attributes or configurations of the diagram may automatically result in corresponding updates of the state diagram.

As described above with respect to the diagram, in various embodiments, paths between state nodes in the state diagram may be represented graphically, e.g., using color, line widths or styles, etc. For example, in one embodiment, a green path may denote a transistor-transistor logic (TTL) input signal, a red path may denote an active TTL output (export) signal, a blue path may denote a software command, and a black path may indicate that the state machine makes the transition, or that a TTL output is inactive. In other embodiments, the different path types may be represented using line types or styles. For example, a solid path may denote a transistor-transistor logic (TTL) input signal, a dashed path may denote an active TTL output (export) signal, a dot-dash path may denote a software command, and a dotted path may indicate that the state machine makes the transition or that a TTL output is inactive. Examples of state diagrams for various diagrams are shown in FIGS. 9B–14B.

It should be noted that as used herein, the term "transistor-transistor logic" refers to a digital signal that is always supposed to be at one of two states, variously referred to as 'high and low' or 'true and false'. The term "digital" is considered synonymous. For example, in 5 Volt digital circuits, 5V is considered high and 0V is considered low (in reality there is a range for each value, e.g., any value received above 2.4 volts is high and any value received below 0.8 volts is low). As another example, in 3.3 Volt digital circuits, 3.3V is considered high and 0V is considered low. The rising edge of a digital signal refers to the transition of the signal from low to high, while the falling edge refers to the transition from high to low. It is these edges that counters count or that trigger actions. Some circuits are also level sensitive and will do or not do something as long as the digital signal is high (or low).

In one embodiment, the user may make modifications to the state diagram which result in corresponding modifications to the diagram. For example, user input to the state diagram may be received modifying a configuration of the state diagram, thereby generating a modified state diagram. The diagram may then be programmatically modified in accordance with the modified state diagram. Referring to the example above where a signal delay was specified for a trigger signal, if the user wished to remove the specified delay, in one embodiment, the user may provide input to the state diagram, e.g., by right clicking on the state icon or node corresponding to the delay, indicating that the delay icon or node is to be deleted. The delay icon or node may be deleted from the state diagram, and in response, the specified delay value in the diagram may be set to zero. Thus, in various embodiments, the diagram and the state diagram may each invoke updates upon the other in accordance with received user input.

FIGS. 9A–17—Example Schematic Configuration Diagrams

FIGS. 9A–17 illustrate various examples of schematic configuration diagrams for representing and specifying timing and triggering for hardware devices, e.g., DAQ boards. More specifically, the example schematic configuration diagrams shown represent timing and/or triggering functionality for various E-Series DAQ boards, as provided by National Instruments Corporation, as well as exemplary high speed timing boards. It is noted that the various diagrams and devices are intended to be exemplary only, and are not intended to limit embodiments of the invention to any particular form or function.

FIGS. 9A and 9B—E Series Timing Configuration: Example 1

Figure 9A:
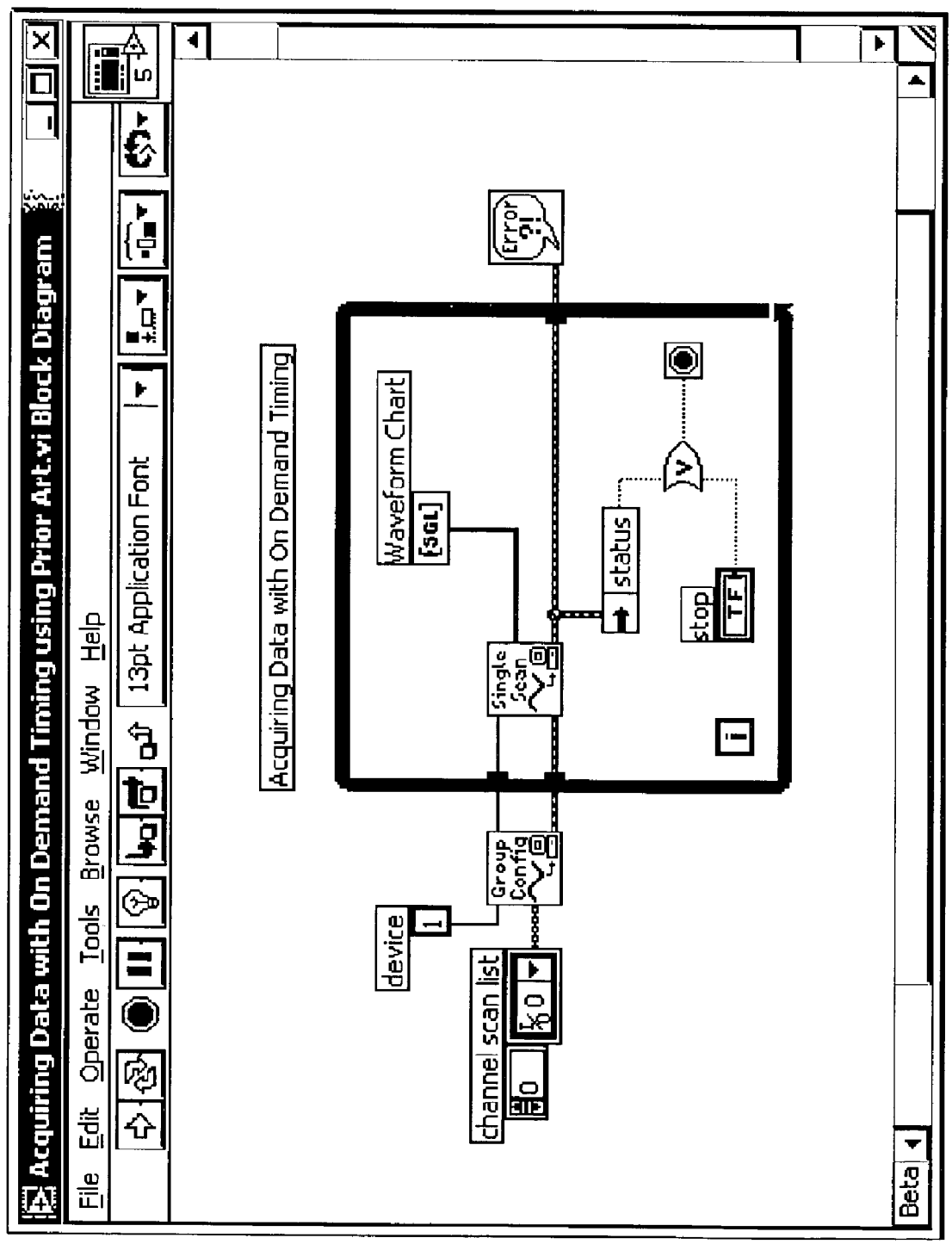
FIGS. 9A–17 illustrate embodiments of example diagrams for a variety of timing and triggering operations.

FIG. 9A illustrates an example prior art approach for configuring analog input timing for an E Series device (board). As FIG. 9A shows, a LabVIEW graphical program or block diagram includes various graphical program nodes, also referred to as VIs (virtual instruments), each representing and/or implementing a particular functionality for a measurement task or operation. In this example, a Single Scan VI or node is included in an execution loop, where data are acquired each time the Single Scan VI executes. Configuration of timing attributes is performed by entering values for various of the VIs or nodes in the program. Note that little if any contextual information is provided regarding the timing and triggering capabilities of the device, i.e., the E Series board. It is further noted that the block diagram of FIG. 9A is a complete program, and thus, a user is required to know at least the basics of graphical programming. It should be noted that in this example, default timing and triggering attributes are used, and thus, no timing and triggering parameters need to be specified or changed, i.e., no specific timing and triggering programming is required. An approach to configuring timing for substantially the same task or operation according to one embodiment of the present invention is described below with reference to FIG. 9B.

Figure 9B:
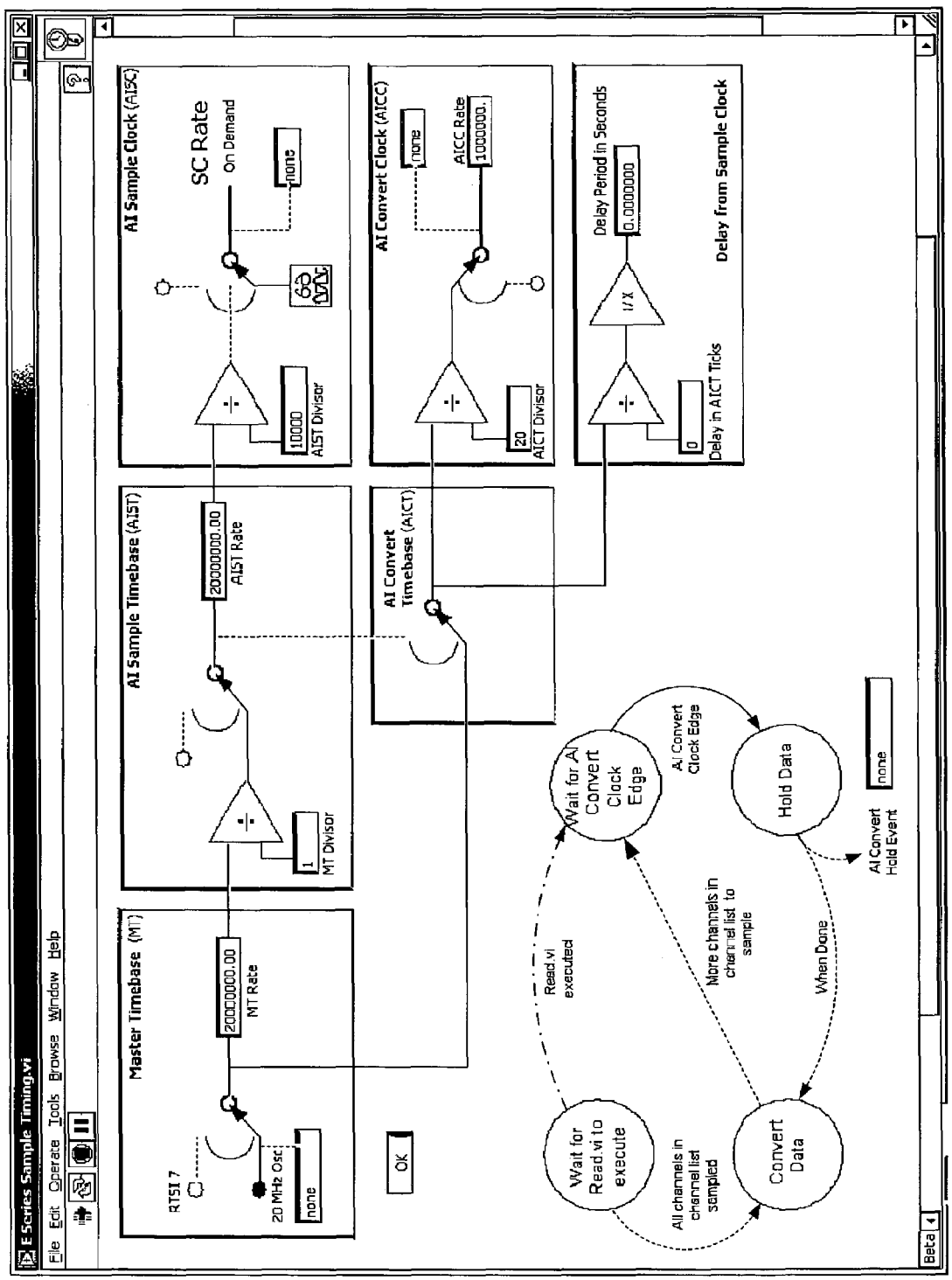

FIG. 9B illustrates a sample diagram for E Series Analog Input Timing, according to one embodiment of the present invention. In the example shown in FIG. 9B, diagram sections include Master Timebase (MT), AI Sample Timebase (AIST), AI Convert Timebase (AICT), AI Sample Clock (AISC), AI Convert Clock (AICC), and Delay from Sample Clock, where each section includes one or more timing components that are configurable by the user. For example, in the MT section, the master timebase may be received from RTSI 7 or a 20 MHz oscillator. The 20 MHz oscillator can also be exported to RTSI 7, as shown.

Each of the other sections include respective divisors, whereby the user may specify time or rate division factors to be applied to the timing signals. Note that in the Delay from Sample Clock section, an inverter (1/x) is included that may operate to invert the timing/delay signal. As FIG. 9B also shows, various of the diagram sections include a routing switch, whereby the user may specify signal routes for the device. Note that in the AISC section, an icon is included representing a read operation (the icon with glasses and a waveform), referred to as a Read VI.

In this example, signal paths are distinguished by line type, where a solid path is active, a dashed signal path is active and exported, and a dotted path is inactive. As shown, many of the components has an associated data entry/display field whereby the value of an attribute for that component may be viewed and specified. As also shown, a plurality of path switches are included in the diagram whereby the user may specify signal routing for the timing signals of the device. Note that in the AISC section, the Sample Clock signal may be exported, although in the configuration shown, no terminal label is indicated ("none"). Similarly, in the AICC section, the AI Convert Clock signal may be exported, although in the configuration shown, no terminal label is indicated ("none").

In the embodiment shown, no signals are being exported. Additionally, instead of a clock, the source of the Sample Clock is a command that occurs when the Read VI call is made. Thus the rate at which the Read VI executes determines the rate at which samples are acquired. This timing method is used when a slowly varying phenomenon is being monitored and a precise time interval between samples is not important.

It is noted that in the prior art approach to configuring the device, as shown in FIG. 9A, the user is required to create a complete graphical program. In contrast, no programming is required to configure the diagram of FIG. 9B.

As FIG. 9B also shows, in this embodiment, a state diagram is displayed corresponding to the configured diagram. The state diagram includes a plurality of state diagram icons or nodes indicating operation of the configured device. Additionally, paths connecting various of the state diagram nodes are shown, where in this example, a solid path denotes a transistor-transistor logic (TTL) input signal, a dashed path denotes an active TTL output (export) signal, a dot-dashed path denotes a software command, and a dotted path indicates that the state machine makes the transition or that a TTL output is inactive.

In the example of FIG. 9B, the fact that the diagram is configured to sample data upon execution of the Read VI is reflected by a "Wait for Read.VI to execute" state node, and the dot-dashed transition path connecting that node to a "Wait for AI Convert Clock Edge" node indicates the execution of the Read VI, as so labeled. The solid path connecting the Wait for AI Convert Clock Edge node to the Hold Data node represents the AI Convert Clock Edge input signal. The other paths in the state diagram are dotted, indicating that the state transitions are initiated or performed by the state machine.

Thus, the state diagram represents operation of the device according to a configuration corresponding to the diagram described above.

FIGS. 10A and 10B—E Series Timing Configuration: Example 2

Figure 10A:
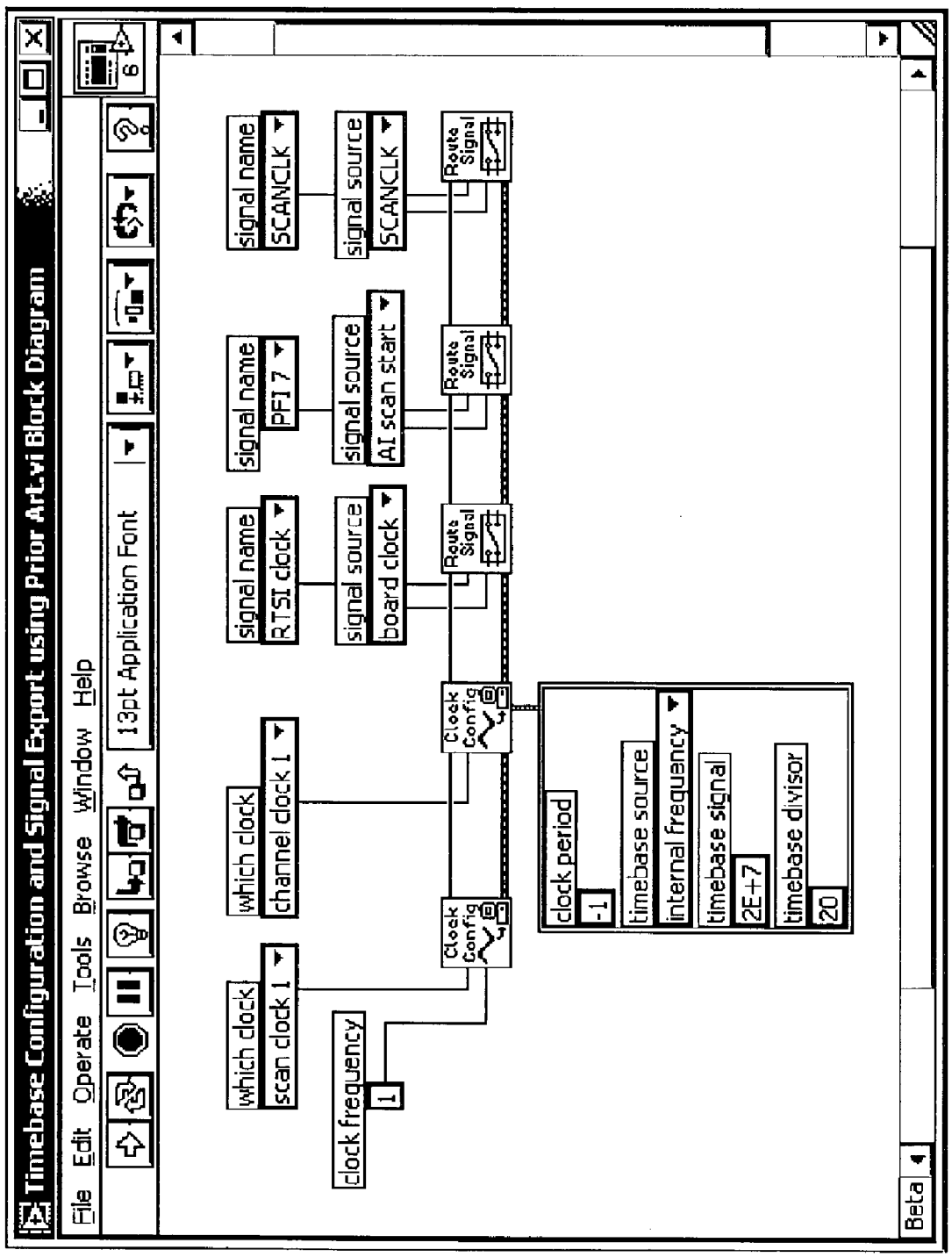

FIG. 10A illustrates another example prior art approach for configuring analog input timing for an E Series device (board) using a LabVIEW graphical program. As FIG. 10A shows, the LabVIEW graphical program or block diagram includes various graphical program nodes for configuring clock signals and for configuring signal routes on the device. More specifically, as FIG. 10A indicates, two clock configuration nodes and three signal routing nodes are provided, where each node has one or more list boxes for receiving user input specifying attributes for that node. For example, a scan clock, also referred to as a sample clock, is configured for one sample per second. As also shown, a channel clock, also referred to as an AI Convert Clock, is also provided. The respective signal routing nodes are configured to specify a board clock, e.g., a 20 MHz Oscillator, as a signal source for a RTSI clock signal terminal, also referred to as RTSI 7; an AI scan start signal source for a PFI 7 signal terminal, and a SCANCLK signal source, also referred to as the AI Convert Hold Event for a SCANCLK signal terminal, also known as AI HOLD COMP. One limitation of this prior art example is that it does not allow the acquisition of samples to be delayed from the scan clock, i.e., the sample clock.

An approach to configuring timing for substantially the same task or operation according to one embodiment of the present invention is described below with reference to FIG. 10B.

Figure 10B:
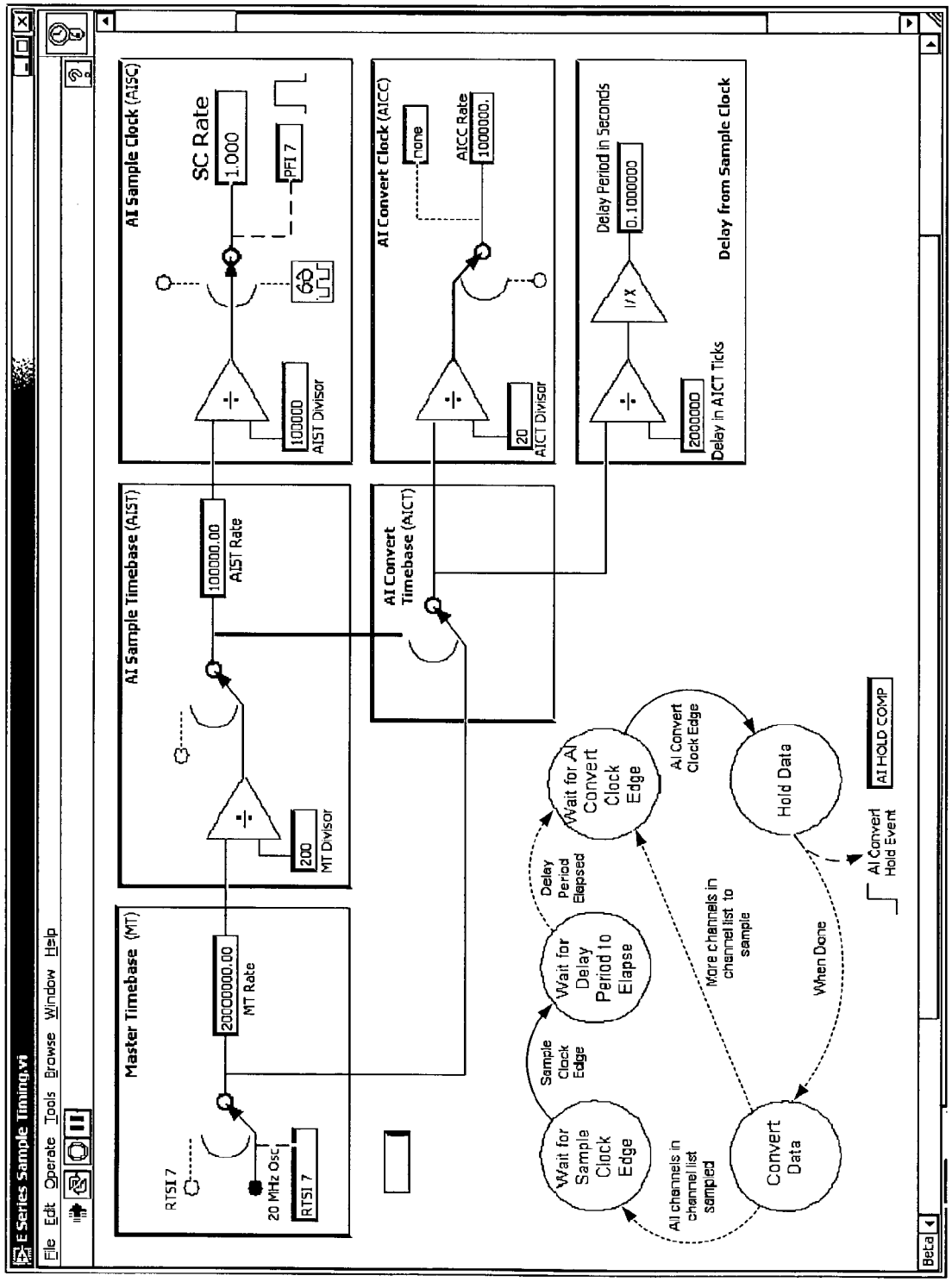

FIG. 10B illustrates another sample diagram for E Series Analog Input Timing, according to one embodiment of the present invention. In the example shown in FIG. 10B, the 20 MHz Oscillator is exported to the RTSI 7 pin so that it may be used by another device, as indicated by the dashed signal path. In this configuration, all clocks including the Sample Clock use their respective onboard sources. Samples are acquired at a precise rate of 1 sample/second, as specified by the SC Rate value of 1.000 in the AISC section of the diagram. The Sample Clock is exported in level mode to PFI 7 to indicate to another device when sample acquisitions are in progress. To maintain a high speed clock as its source the AI Convert Timebase source is switched to the Master Timebase as the AI Sample Timebase must be divided by 200 to produce the slow Sample Clock rate. According to the configuration shown, the acquisition of each set of samples will be delayed 0.1 seconds from each AI Sample Clock, as indicated by the specified Delay Period in Seconds value of 0.10000000 in the Delay from Sample Clock section of the diagram. The AI Convert Hold Event is exported to the AI HOLD COMP pin so that an external multiplexer device can switch to the next analog input channel.

As FIG. 10B also shows, in this embodiment, in contrast to the Wait for Read.VI to execute state node, in this configuration, the state diagram includes a "Wait for Sample Clock Edge" state node, reflecting the fact that in the diagram above, the AI Sample Clock is used to control the sampling process. Additionally, a delay node is included (a "Wait for Delay Period to Elapse" state node), reflecting the non-zero delay period specified in the Delay from Sample Clock section.

As mentioned above, in one embodiment, user input may be received to the diagram via various mechanisms, e.g., entry fields, switches, and icons. One example of an icon which is operable to receive user input is a "signal behavior" icon, as shown by the square wave signal waveform icon in the AISC section of FIG. 10B. A user may click on this icon to specify the behavior of the signal pulse, e.g., where the user clicks on the icon to cycle through the available states, e.g., pulse or level, rising or falling polarity, active high level or active low level, among others. The current configuration specifies a "level" behavior of the pulse, where the pulse stays high as long as the samples are being taken.

Another example of a signal behavior icon is shown to the left of the AI Convert Hold Event text (or label) in the state diagram. In this example, the icon indicates that the hold event is exported as a rising edge digital signal.

Thus, the state diagram represents operation of the device according to a configuration corresponding to the diagram described above.

FIGS. 11A and 11B—E Series Timing Configuration: Example 3

Figure 11A:
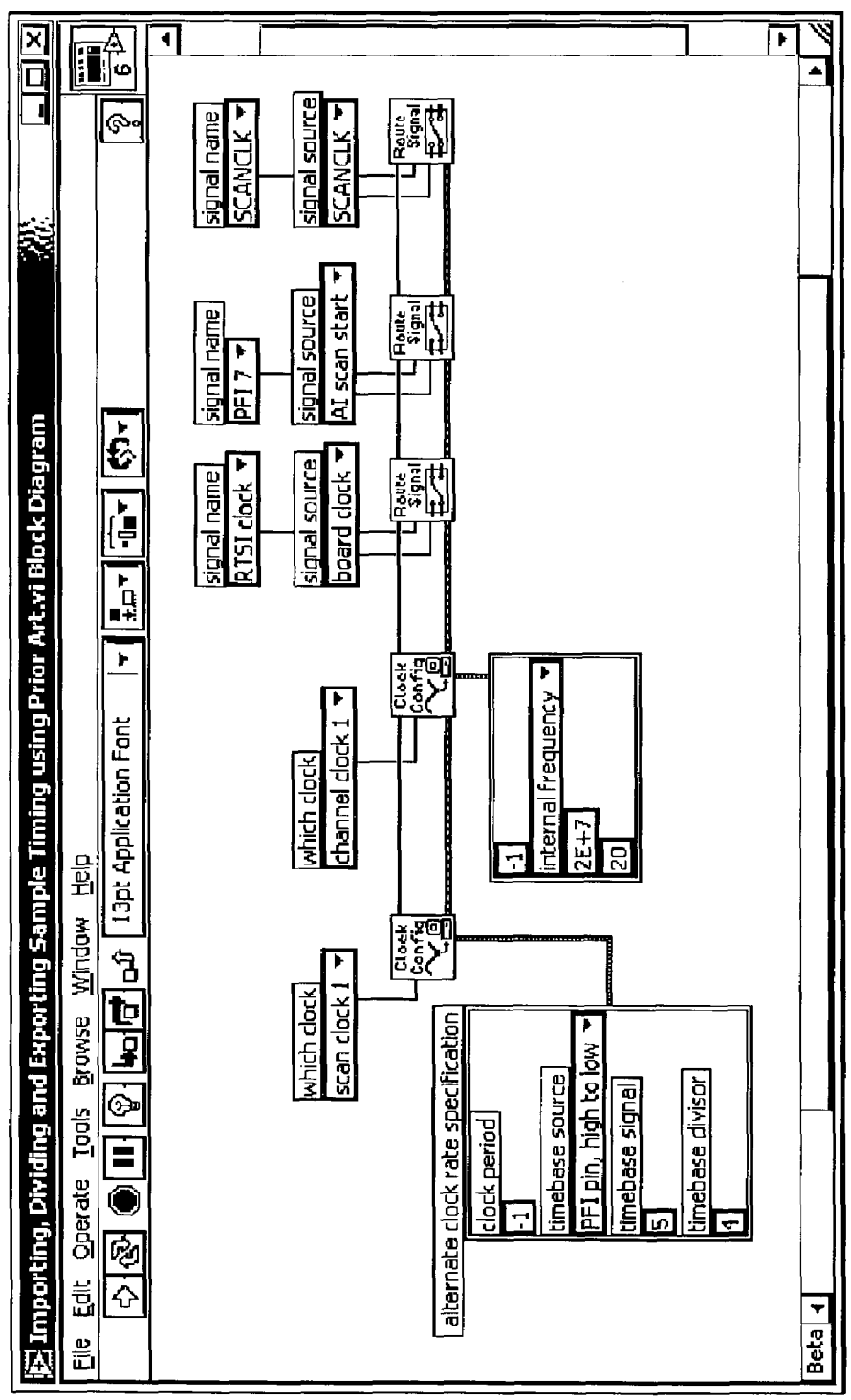

FIG. 11A illustrates another example prior art approach for configuring analog input timing for an E Series device (board) using a LabVIEW graphical program. As FIG. 11A shows, the LabVIEW graphical program shown is similar to that of FIG. 10A. However, in this case, an alternate configuration is shown for the scan clock configuration node. More specifically, rather than relying on default values, clock period, timebase source, timebase signal, and timebase divisor are specified via respective list boxes. It is noted than in this example, selecting the pulse or level output behavior of the exported Sample Clock (SCANCLK) is not supported.

Figure 11B:
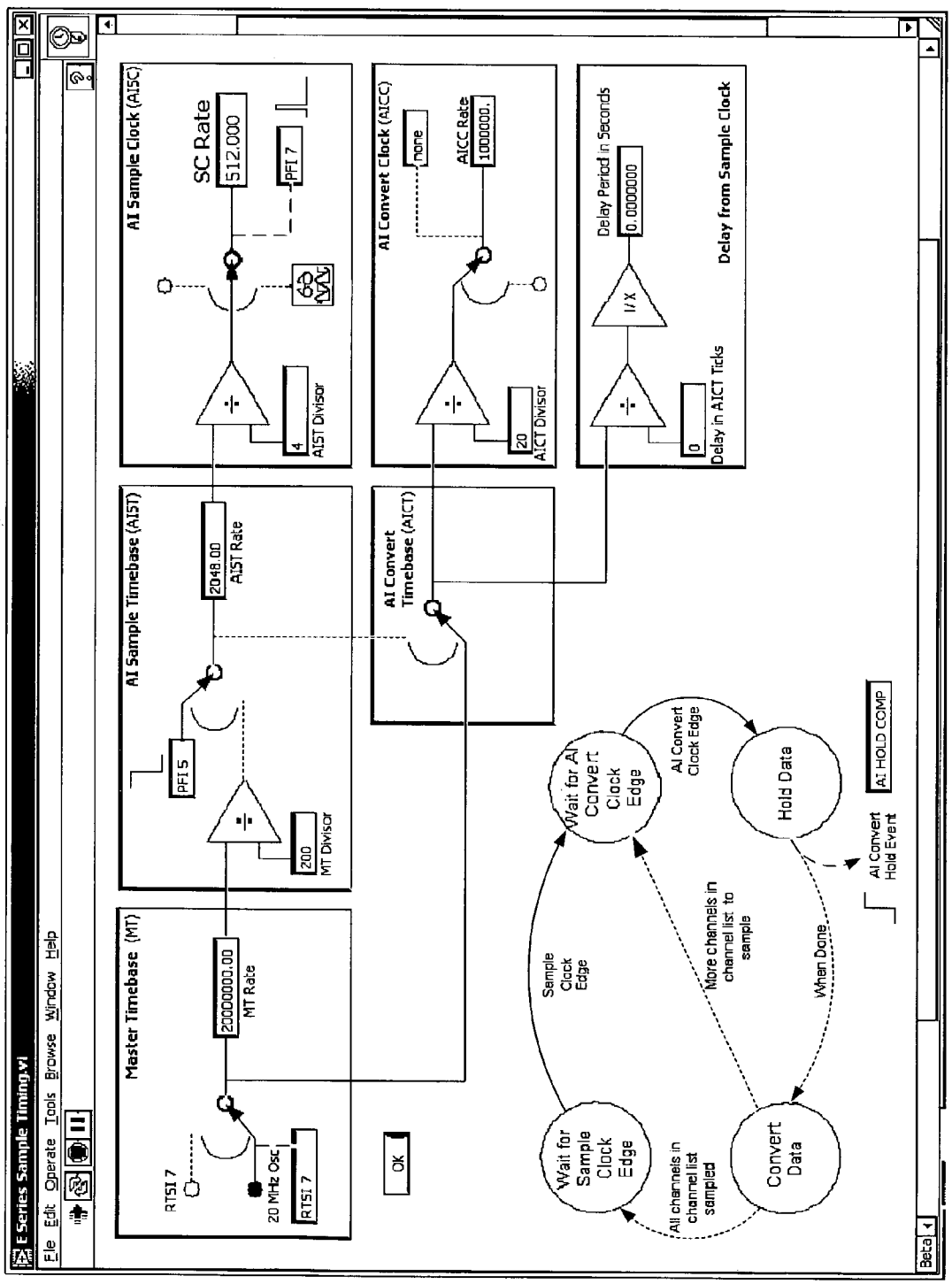

FIG. 11B illustrates a sample diagram for E Series Analog Input Timing for similar timing functionality as the prior art program of FIG. 1A, according to one embodiment of the present invention. In the example shown in FIG. 11B, a sample is taken every 4 ticks of the falling edge of an external signal at pin PFI 5. The Sample Clock is exported to PFI 7 in edge mode to signal another device that each sample is being acquired by this device. The source of the AI Convert Timebase is switched to the 20 MHz Oscillator to avoid using the slow signal at the PFI 5 pin.

As FIG. 11B also shows, a state diagram corresponding to the timing diagram is displayed, where the state diagram only differs from that of FIG. 10B in that there is no delay configured, and thus no Wait for Delay Period to Elapse state node.

Figure 12:
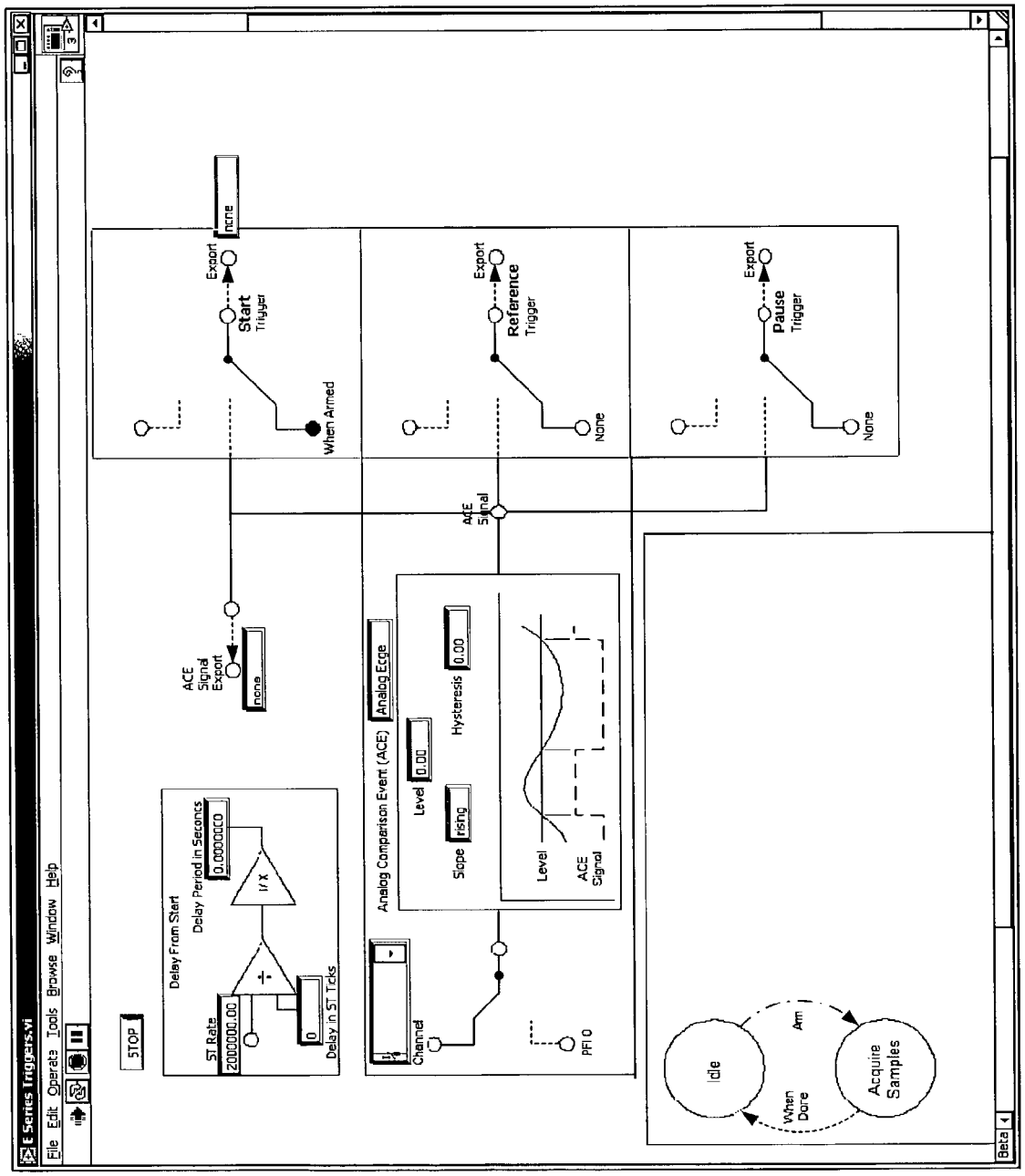

FIG. 12—E Series Triggering Configuration: Example 1

FIG. 12 illustrates one embodiment of a diagram for representing and configuring E Series Analog Input Triggering. In this embodiment, the diagram includes respective sections for specifying Delay From Start, Analog Comparison Event (ACE), and ACE Signal Export, including Start, Reference, and Pause Triggers. In the example shown, no triggers are configured or exported, which is the default configuration of the device. Thus, no prior art graphical program approach is presented.

In the embodiment shown, a graphical illustration of Level, Hysteresis, and ACE Signal for the Analog Comparison Event is provided to the user to aid in visualizing the mechanism and effect of the triggering configuration, where the analog signal (solid smooth waveform) and ACE signal (dashed digital signal, because it is an output of this circuit) and other graphical elements or parts may change to illustrate the effects of modifying the configuration of the analog comparison circuitry. For example, when the slope is changed, or the edge or window modes are selected, or when hysteresis is added (non-zero) or removed (zero), the picture in the ACE section (solid and dashed signal lines and vertical event marker lines, and level, hysteresis and top and bottom lines) may change to reflect the new configurations. In particular, FIG. 12 shows the level line relevant in Analog Edge mode, with user input fields shown for level, slope, and hysteresis. As described below, FIG. 13B, still in Analog Edge mode, shows a hysteresis line associated with a non-zero hysteresis value, and FIG. 13C shows the Top and Bottom lines displayed for Analog Window Mode.

In one embodiment, the Analog Comparison Event configuration window may allow user configuration of the analog comparison event via interaction with the diagram. For example, similar to the state diagrams described above, the user may interact directly with the Analog Comparison Event diagram to specify the trigger properties, e.g., by moving these lines up and down to specify different values of level, hysteresis, or window top and bottom, although other interaction mechanisms are also contemplated.

The fact that no triggers are configured in the diagram of FIG. 12 is reflected in the simple state diagram shown in the bottom left corner of the Figure, where the only two states illustrated are an Idle state and an Acquire Samples state.

Figure 13A:
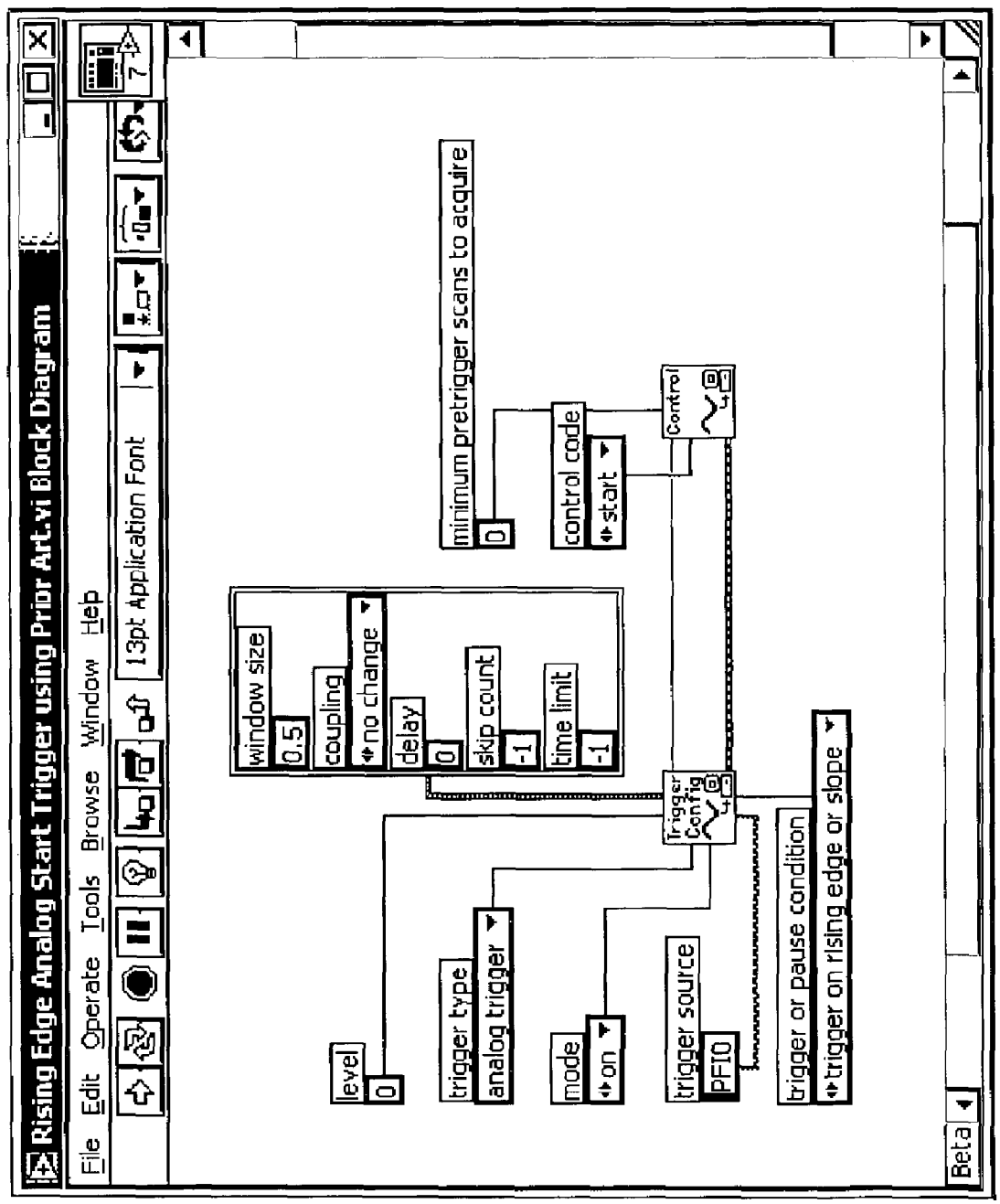
Figure 13B:
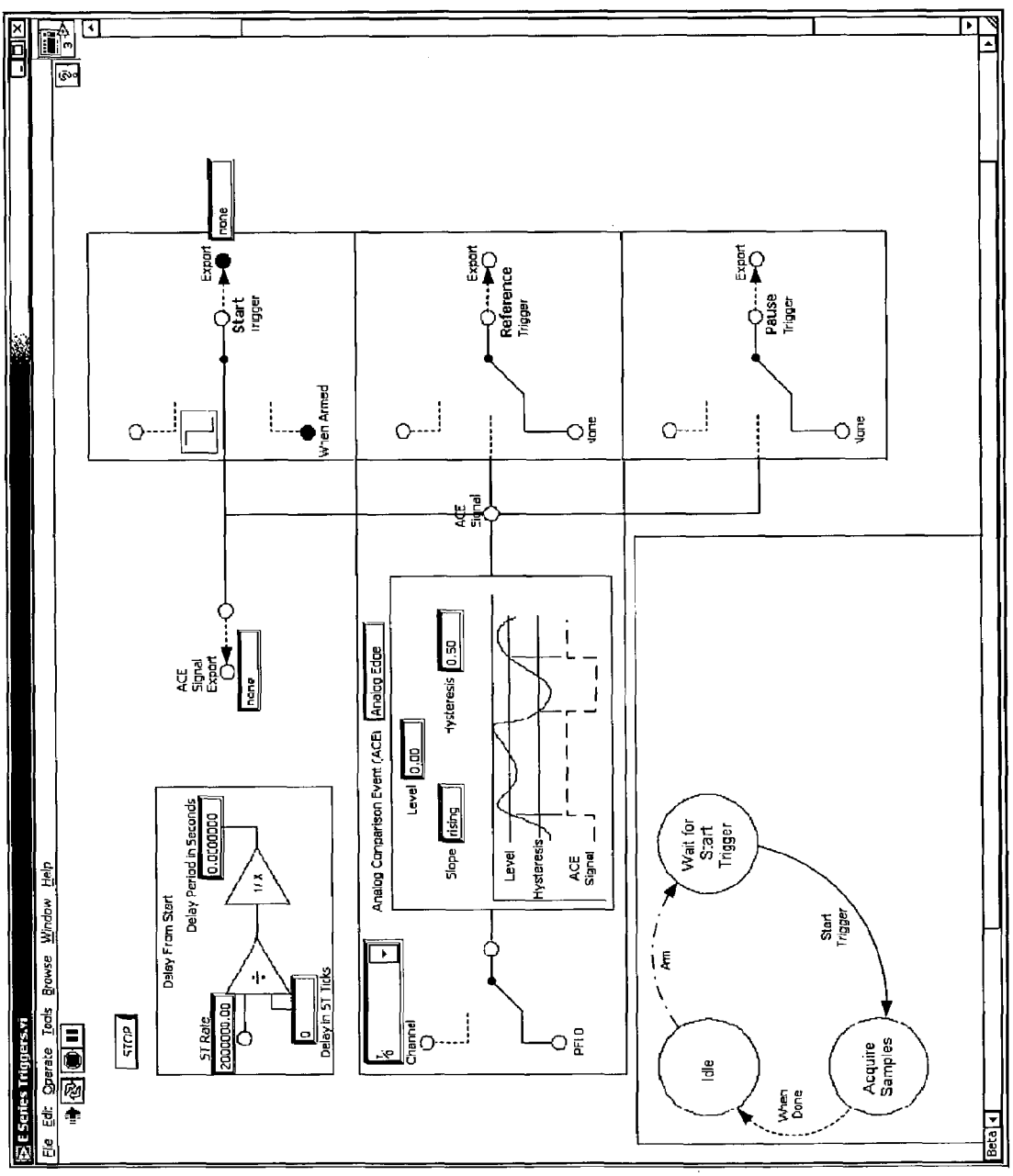
Figure 13C:
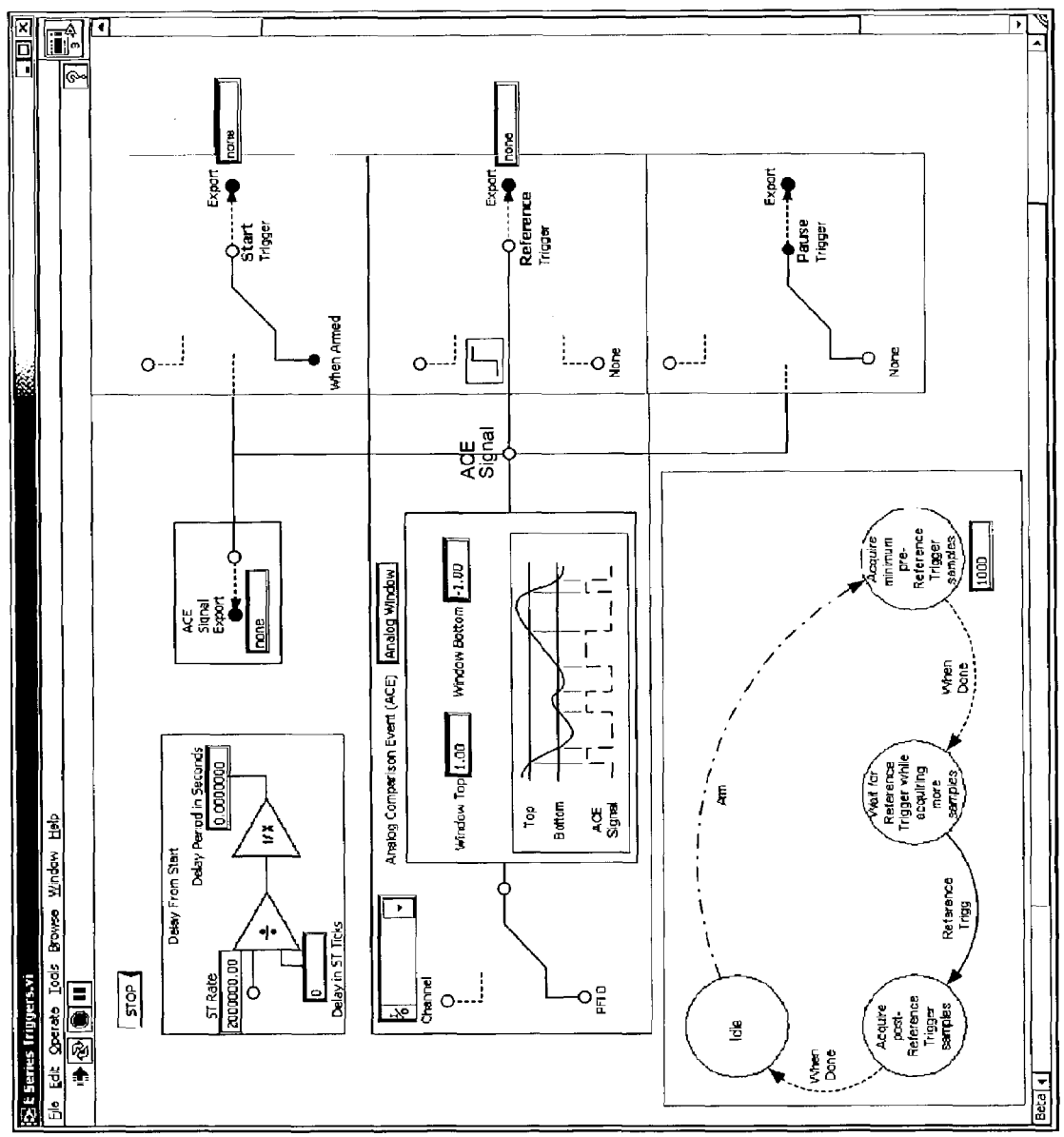

FIGS. 13A–13C—E Series Triggering Configuration: Example 2

FIG. 13A illustrates a prior art approach to configuring Analog Input Triggering for an E Series device using a LabVIEW graphical program or block diagram. As FIG. 13A shows, Trigger Configuration and Control nodes are included in the graphical program, where each node has a variety of associated list boxes and/or entry fields for receiving user input specifying triggering attributes for the device. In this example, an analog trigger signal is generated based on the rising edge of an analog signal from PFI0 pin, with windowing parameters specified as shown, e.g., window size of 0.5, no delay, etc. The Control node is provided to configure minimum pre-trigger scans or sampling, here specified as zero, i.e., no pre-trigger scans. As FIG. 13A shows, there is little or no contextual information to guide the user in the specification process, and thus, the task of creating the graphical program to configure the triggering may be overwhelming or at least difficult to some users.

In contrast, FIGS. 13B and 13C illustrate example diagrams for graphically representing and configuring similar Analog Input Triggering for the E Series device, according to one embodiment of the present invention. In the configuration shown in FIG. 13B, an Analog Edge with hysteresis Start Trigger is configured using a signal at the PFI 0 pin as source. The Start trigger is configured to occur on the falling edge of the Analog Comparison Event (ACE) signal which is output by the analog trigger circuit when the input signal matches the trigger characteristics. Note the hysteresis line in the ACE portion of the diagram reflecting the fact that a non-zero hysteresis value (0.5) has been specified.

Reflecting this use of the Start Trigger, the state diagram includes a "Wait for Start Trigger" node. More specifically, once an "Arm" software command is received, denoted by the dot-dash transition path, the system will wait for a Start Trigger, at which point the sample acquisition process will occur, as indicated by the solid transition path, labeled "Start Trigger", leading to an "Acquire Samples" state. Once the samples have been acquired, an idle state resumes, as shown.

The diagram of FIG. 13C represents a timing/triggering configuration where the Start trigger is configured to occur based on an analog window, i.e., based on the (solid) analog signal crossing a window Top value or Bottom value, represented by the lines labeled "Top" and "Bottom" in the ACE section of the diagram, as shown.

FIGS. 14A and 14B–E Series Triggering Configuration: Example 3

Figure 14A:
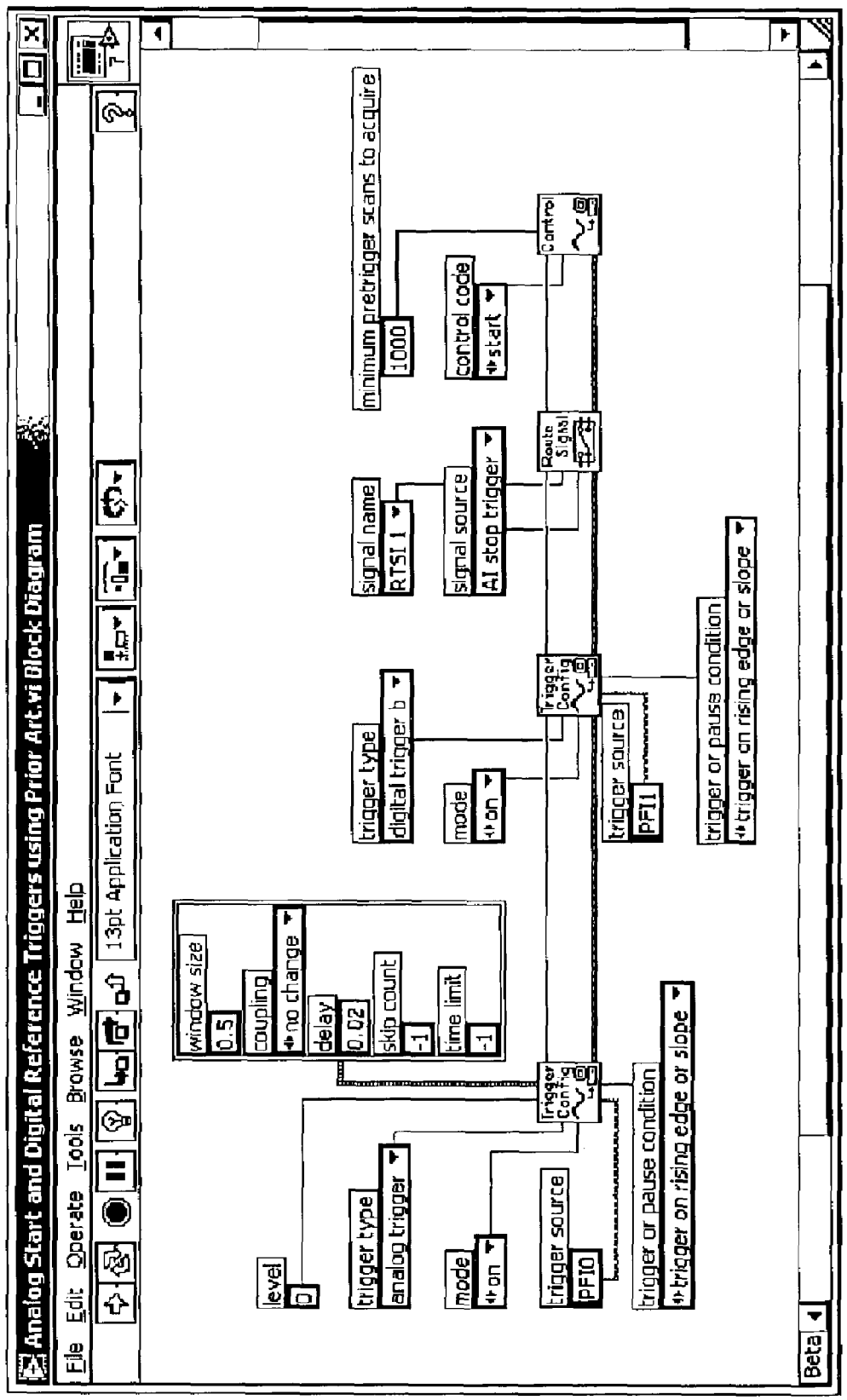

FIG. 14A illustrates a prior art approach to configuring Analog Input Triggering for an E Series device using a LabVIEW graphical program or block diagram. As FIG. 14A shows, the graphical program includes two trigger configuration nodes, a signal routing node, and a control node, each with respective list boxes for receiving user input specifying attributes for device triggering. More specifically, the Start trigger is specified as an analog trigger signal from PFI0 (trigger source), and a trigger or pause condition is configured for the rising edge of the signal. This matches the slope setting on the ACE block in the diagram of FIG. 14B, described below. It is noted that a limitation of this prior art example is that it does not allow also setting which edge of the ACE signal to use. Note that a delay of 0.02 is specified for the start trigger.

The digital trigger b, configured by the second trigger configuration node, is shown received at PFI1 (trigger source) and is the Reference trigger for the task or operation. Note that in this example, the minimum pre-trigger scans to acquire is configured with a value of 1000 (via the control node). It should be noted that typically, the user is required to create the graphical program, e.g., from scratch, and thus must know the appropriate nodes and attributes to include, as well as any attribute dependencies or other configuration subtleties of the device.

Figure 14B:
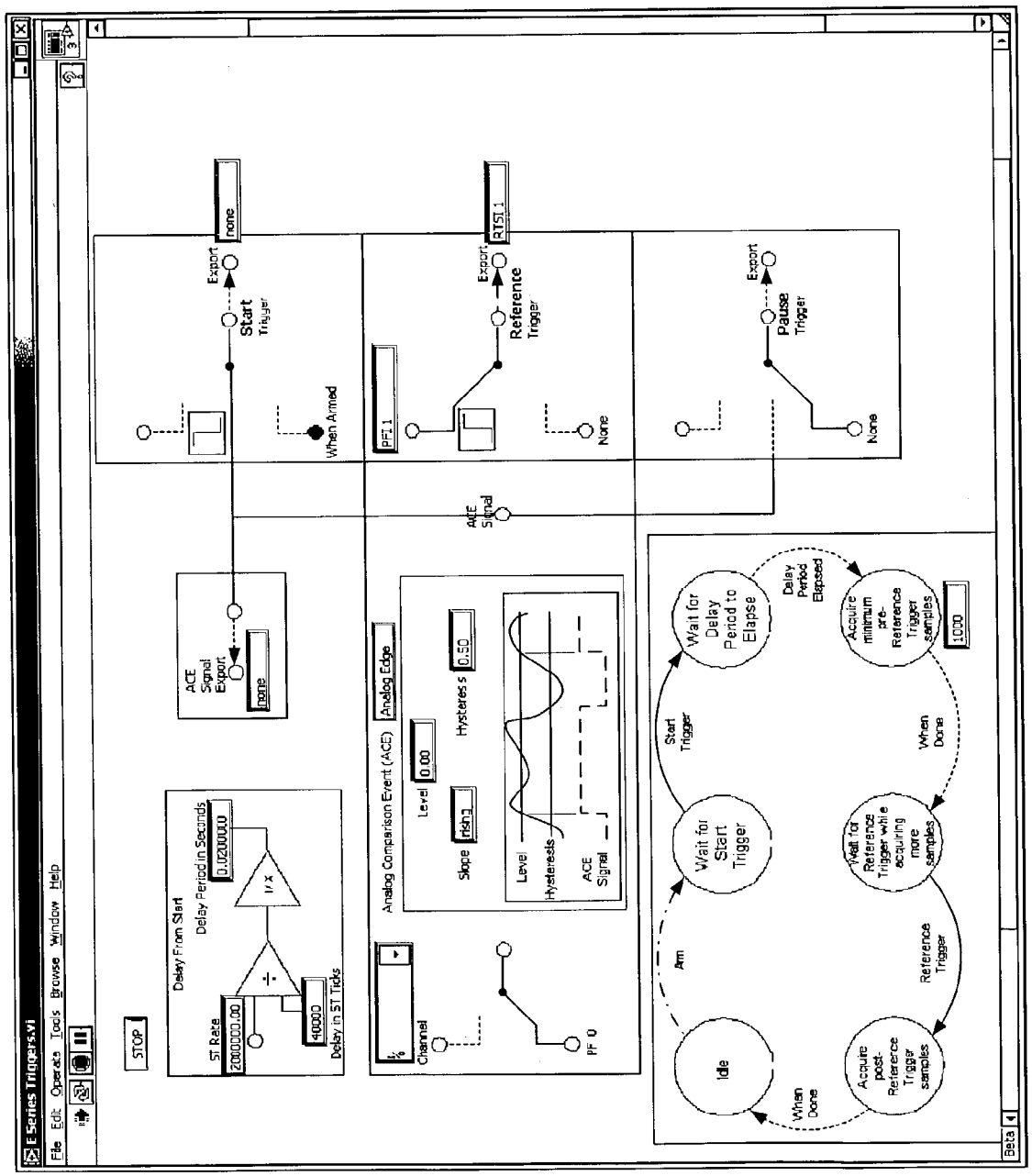

In contrast, FIG. 14B illustrates an example diagram for graphically representing and configuring similar Analog Input Triggering for the E Series device, according to one embodiment of the present invention. In the configuration shown, an Analog Edge with hysteresis Start Trigger is configured using the signal at PFI 0 pin as source. The Start trigger is configured to occur on the falling edge of ACE signal. A Digital Edge Reference Trigger is configured to occur on the falling edge of signal at PFI 1 pin and is exported to RTSI 1. In this configuration 1000 pre-trigger samples will be acquired, and pre-trigger sampling is configured to begin after a delay of 0.02 seconds from the Start Trigger occurrence.

Reflecting this addition of a delay of the sampling with respect to the start trigger, the state diagram includes a "Wait for Delay Period to Elapse" node coupled to the Wait for Start Trigger node. More specifically, once an "Arm" software command is received, denoted by the dot-dash transition path, the system will wait for a Start Trigger, as indicated by the solid transition path labeled "Start Trigger", then wait for the specified delay period, at which point the sample acquisition process will occur, as shown. As FIG. 14B also shows, the pre-trigger sampling process is represented by an "Acquire Minimum Pre-Reference Trigger Samples" state node which, after the specified 1000 pre-samples are acquired, transitions to a "Wait for Reference Trigger While Acquiring More Samples" state. When the reference trigger occurs, this system transitions to an "Acquire Post-Reference Trigger Samples" state, where the post-reference trigger samples are acquired. As shown, once the samples are acquired, the idle state resumes.

Figure 15:
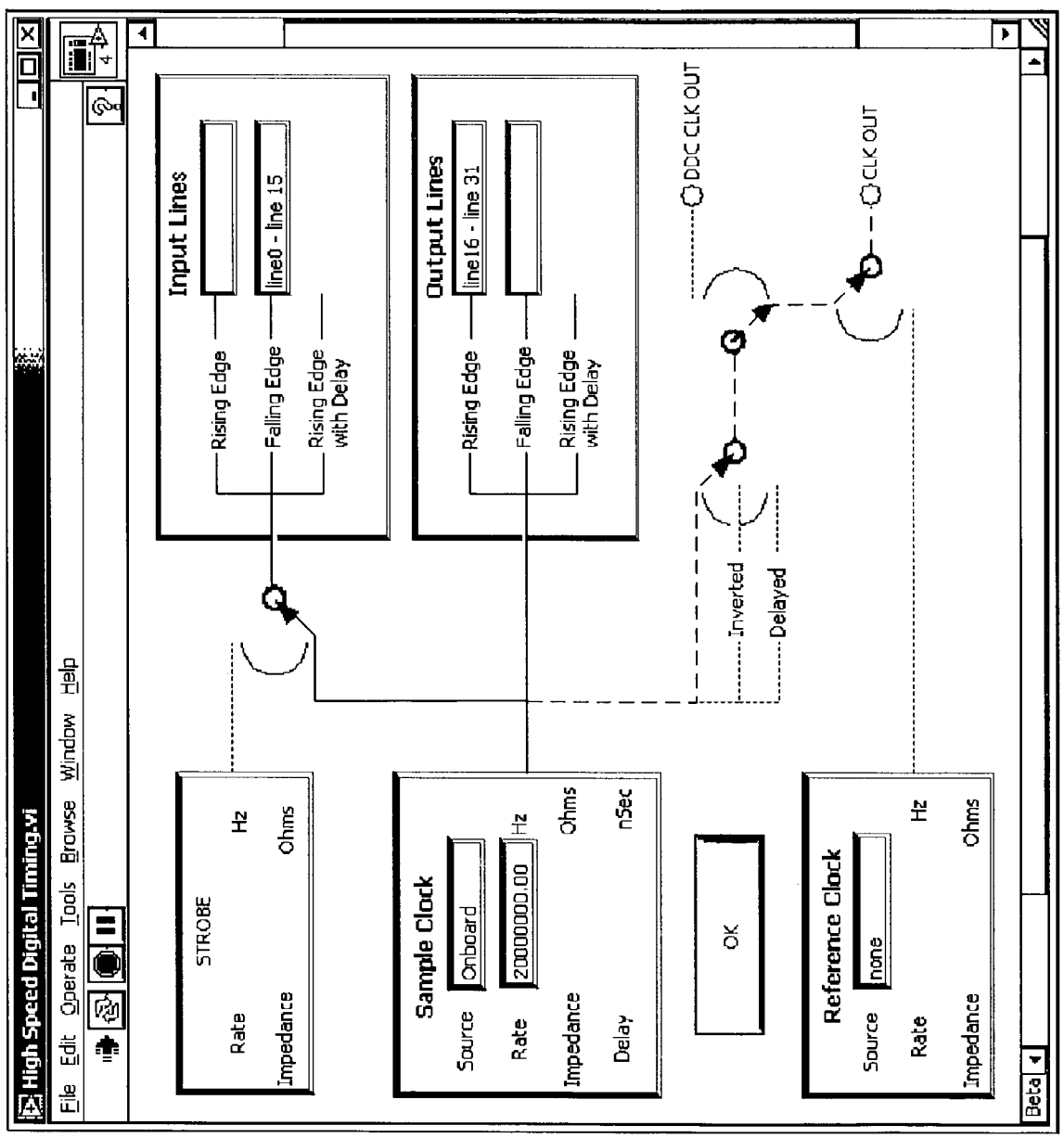
Figure 16:
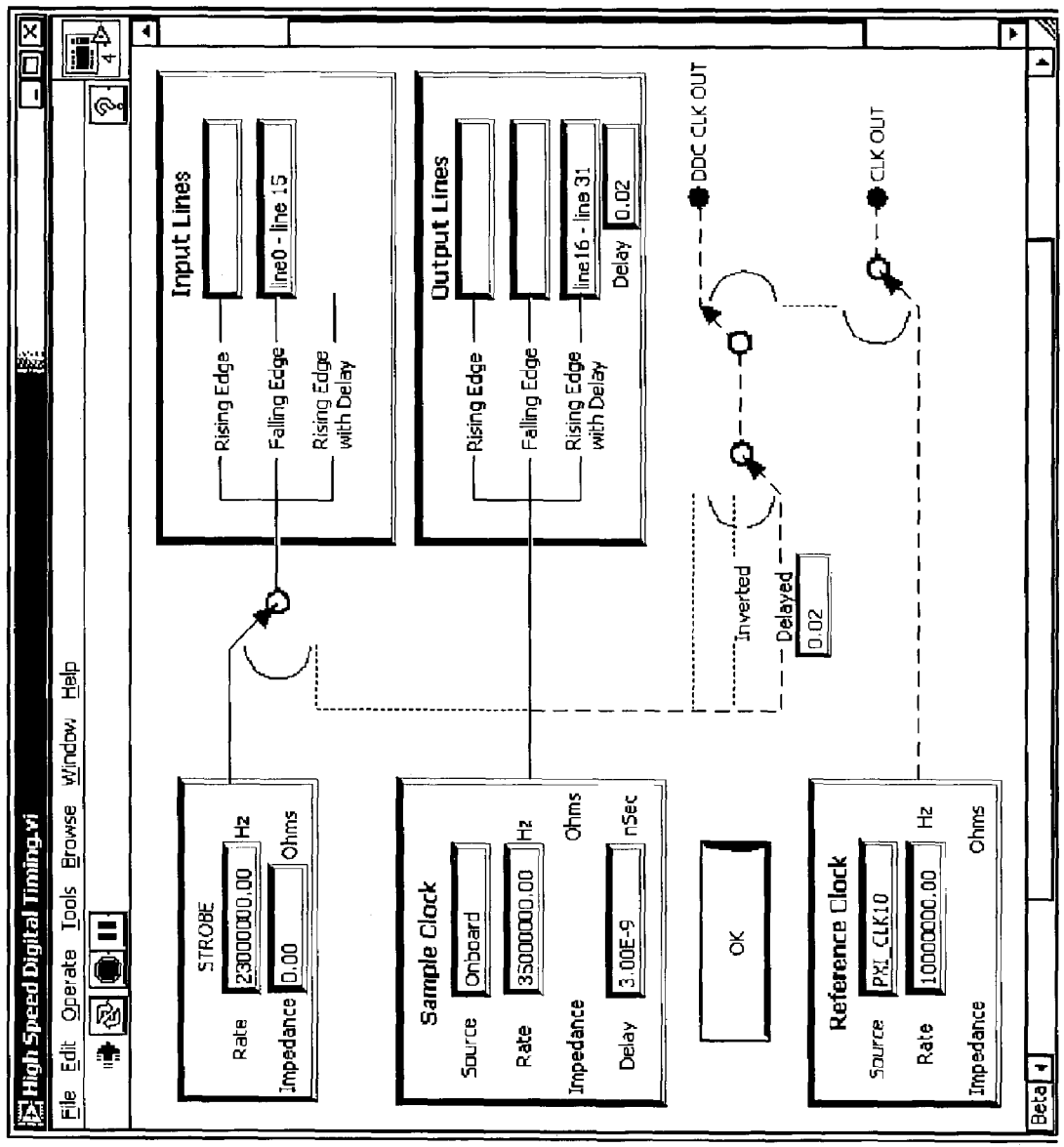
Figure 17:
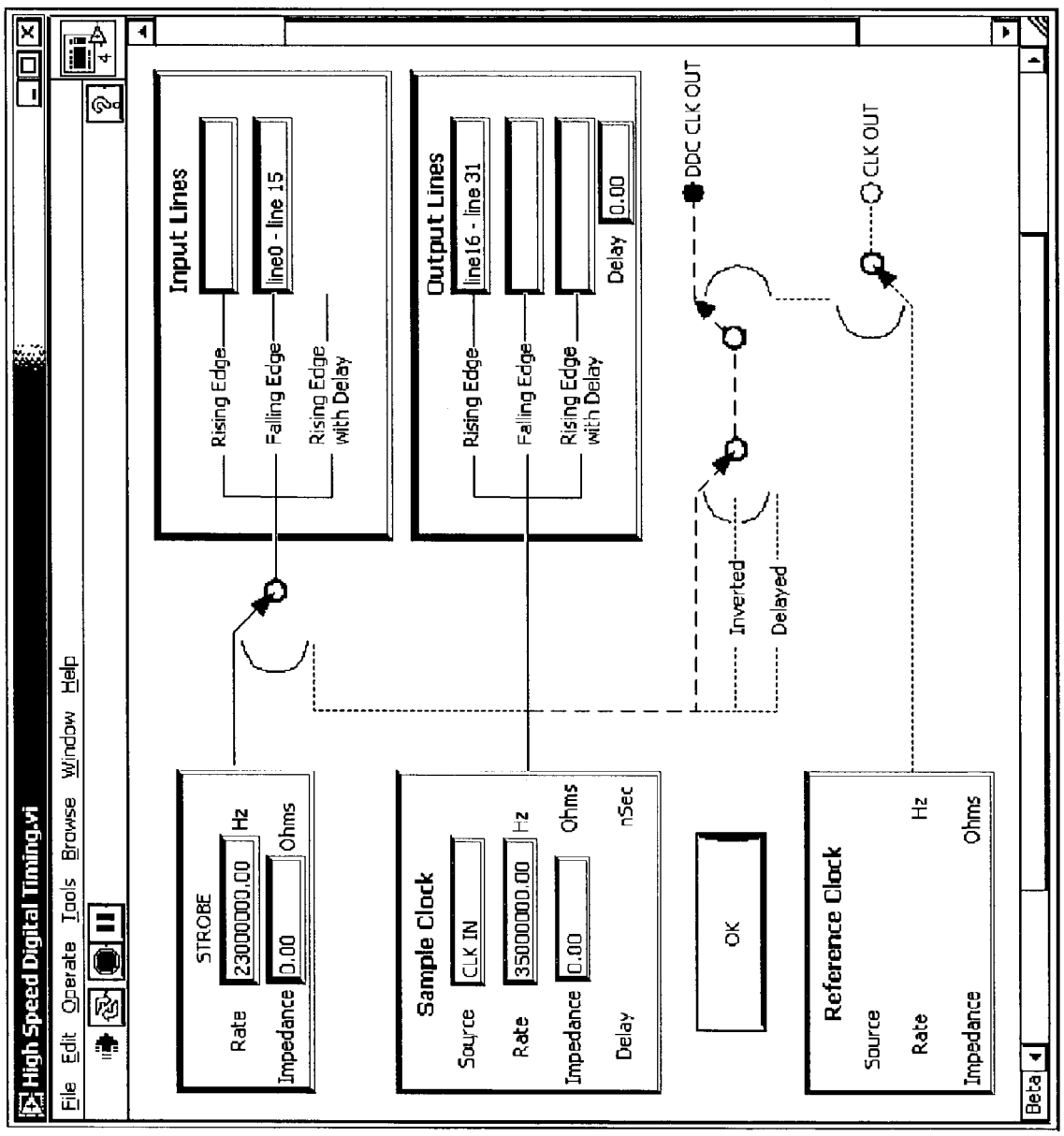

FIGS. 15–17—High Speed Digital Timing Configuration

FIGS. 15–17 illustrate various example configurations of a diagram for representing and configuring high speed digital timing, according to one embodiment. It should be noted that the high speed timing configuration diagrams shown are meant to be exemplary and are not intended to limit the design or functionality of the diagrams to any particular type or set of functions.

In the example configuration of FIG. 15, the onboard sample clock provides a 20 MHz signal, as indicated in the Sample Clock section of the diagram. As shown, the input lines are clocked on the falling edge of this signal, the output lines on the rising edge, and an inverted version of this signal is exported to the CLK OUT terminal. Note that data entry fields are provided for user specification of input and output lines.

In the example configuration of FIG. 16, the onboard sample clock provides a 35 MHz signal. Delays are now available on this signal as it is greater then 25 MHz. As shown, in this configuration the output lines are clocked on the delayed rising edge, and a delayed version of this signal is exported to the DDC CLK OUT terminal.

As FIG. 16 also shows, the input lines are clocked on the falling edge of the signal at the STROBE terminal. No delay is available here, and this signal cannot be exported. A 10 MHz Reference clock is configured to be received at the PXI_CLK10 pin and exported to the CLK OUT pin. The Sample Clock Delay from the Reference Clock is available because there a Reference Clock is configured, specifically, a reference clock signal from PXI_CLK10.

In the example configuration of FIG. 17, an external signal at the CLK IN pin provides a 35 MHz signal. The output lines are clocked on the rising edge which is directly exported to the DDC CLK OUT terminal. Because the clock is coming from the CLK In pin, the Impedance is now relevant. Also, when the clock comes from the CLK IN pin, the Reference clock is no longer relevant. Thus, the Sample Clock Delay from the Reference clock is no longer relevant.

Figure 18:
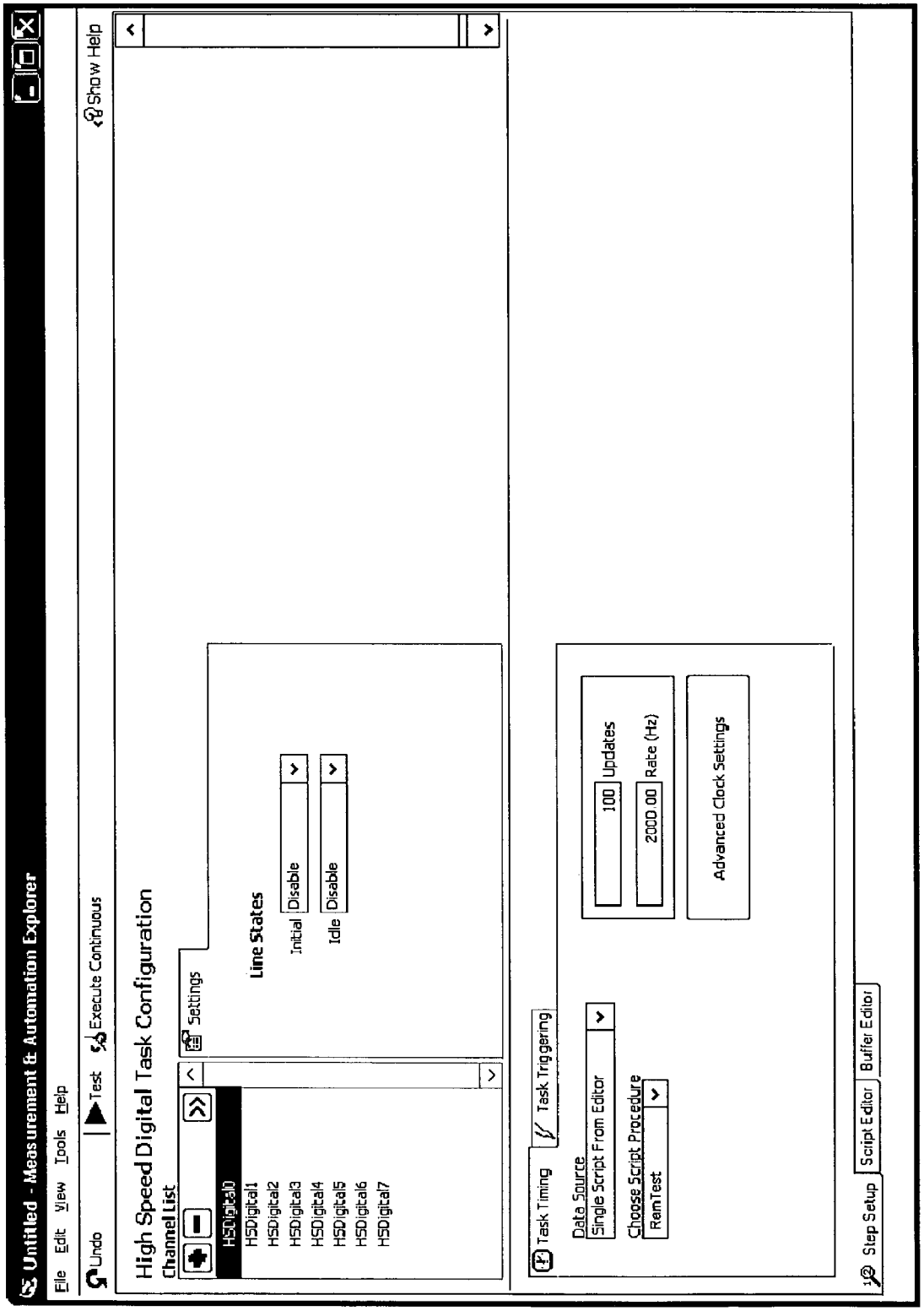
FIG. 18 illustrates a graphical configuration utility, according to one embodiment.

FIG. 18—High Speed Digital Task Configuration With Graphical Configuration Utility As mentioned above, in one embodiment, the displaying of a diagram for a specified device may be initiated from a graphical configuration utility. FIG. 18 illustrates one embodiment of a graphical configuration utility for invoking diagrams such as those described above. For example, the user may invoke a diagram display for the specified device via a menu, key-command, button, etc., and may specify which device or family of devices is to be represented by the diagram. Thus, the diagram may be selected and displayed based on the user-specified hardware product or product family. As also described above, in one embodiment, a hardware discovery process may be performed to determine what devices are currently installed on or in the computer system. The user may then select from among the discovered devices to invoke the appropriate diagram.

In the example shown in FIG. 18, a diagram for configuring the timing settings of a device may be launched by clicking on a button labeled "Advanced Clock Settings". The diagram, e.g., a panel displaying the diagram, may then appear, and the user may configure the timing settings by manipulating the panel's controls. The effect of these manipulations on the entire device as well as the actual settings to be used by the device may then be graphically presented to the user, in response to which the user may make further adjustments.

In one embodiment, when satisfied with the configuration, the user may provide input, e.g., by clicking on a button labeled "Apply" or its equivalent, resulting in the configured parameters or settings being stored, optionally dismissing the diagram panel and returning to the configuration utility. In one embodiment, the configuration settings made via the diagram may be saved along with other configuration settings made with other parts of the configuration utility. In one embodiment, the user specifying "Apply" or its equivalent may result in configuration of the device with the attributes specified by the diagram. In other words, the configuration utility, or alternatively, the diagram itself, may include functionality for programmatically implementing the specified configuration, thereby configuring the specified device.

As also noted above, in one embodiment, the configured diagrams may be used as to generate application code. This generated code may be executable to implement the same configuration settings that the diagram specifies at the time the code is generated. One embodiment of this code generation capability may generate function calls in a textual programming language, e.g., the C programming language, JAVA, etc. Another embodiment of this code generation capability may generate graphical code in a block diagram, e.g., a LabVIEW graphical program.

The present specification describes embodiments of the invention which may be used to specify timing and triggering aspects of a system such as for test and measurement, process control, product design, etc. However, it is noticed that various embodiments of the present invention may be used for a number of different types of systems. For example, embodiments of the invention may be used in any of various systems which utilize or require user specification of signal routing or signal paths. For example, alternate embodiments that are anticipated or which may use the present invention include design of systems for mixing audio and/or video signals, such as television broadcasting, audio mixing, and sound recording, among others. Other embodiments may be used to facilitate the specification or routing of signals in communication systems, such as a telephone company's central office, a network system, etc.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A computer-implemented method for graphically specifying hardware timing and triggering, the method comprising:

displaying a diagram that graphically represents user-configurable timing and triggering components of a device, and wherein timing and triggering for said device is determined by a plurality of timing and triggering attributes;

receiving user input to the diagram specifying one or more of said timing and triggering attributes of the device;

modifying said diagram in accordance with said specified one or more timing and triggering attributes, wherein said diagram represents configuration of said user-configurable timing and triggering components of the device; and storing said specified one or more timing and triggering attributes, wherein said one or more timing and triggering attributes are usable to configure timing and triggering for said device.

2. The method of claim 1,
wherein said modifying said diagram in accordance with said specified timing and triggering attributes comprises programmatically configuring the diagram in accordance with said user input to generate a configured diagram, wherein said configured diagram represents configuration of said user-configurable timing and triggering components of the device.

3. The method of claim 2,
wherein said receiving user input comprises receiving user input to a first component in the diagram; and
wherein said programmatically configuring comprises programmatically configuring a second component based on said user input to the first component in the diagram.

4. The method of claim 3, wherein said progranimatically configuring the second component based on said user input to the first component in the diagram comprises:
analyzing the user input to the first component in the diagram;
programmatically determining modifications to one or more dependent attributes of the second component based on said user input; and
modifying said one or more dependent attributes.

5. The method of claim 1, wherein said diagram graphically represents operational relationships between the timing and triggering components of the device.

6. The method of claim 1, wherein said diagram includes a plurality of icons which represent the timing and triggering components of the device.

7. The method of claim 1, wherein said diagram includes a plurality of signal paths indicating coupling between two or more of the timing and triggering components of the device.

8. The method of claim 1, wherein said displaying the diagram comprises:
displaying the diagram with a default configuration.

9. The method of claim 1, wherein said receiving user input to the diagram specifying one or more of said timing and triggering attributes of the device comprises:
receiving user input specifying values for said one or more of said timing and triggering attributes of the device.

10. The method of claim 9, wherein said specifying one or more of said timing and triggering attributes of the device comprises specifying one or more of:
values of at least one timing parameter;
values of at least one triggering parameter;
at least one timing signal route; and
at least one triggering signal route.

11. The method of claim 10, wherein said specifying at least one timing signal route comprises specifying one or more of:
a timing signal source; and
a timing signal destination.

12. The method of claim 10, wherein said specifying at least one triggering signal route comprises specifying one or more of:
a triggering signal source; and
a triggering signal destination.

13. The method of claim 10, wherein said specifying one or more of said timing and triggering attributes of the device comprises specifying values of one or more timing and triggering signal parameters.

14. The method of claim 13, wherein said specifying values of one or more timing and triggering signal parameters comprises specifying values of one or more of:
a rate;
a divisor;
a delay;
a polarity;
an impedance;
a pulse or level output behavior;
a window or edge trigger mode;
a hysteresis;
a voltage level; and
a slope.

15. The method of claim 1, wherein said displaying said diagram comprises:
displaying timing and triggering signal routes of the device.

16. The method of claim 15, wherein said displaying timing and triggering signal routes of the device comprises:
graphically indicating a respective status of each route.

17. The method of claim 16, wherein said graphically indicating the respective status of each route comprises:
displaying said timing and triggering signal routes using colors to indicate the respective status of each route.

18. The method of claim 16, wherein said graphically indicating the respective status of each route comprises:
displaying said timing and triggering signal routes using line types to indicate the respective status of each route.

19. The method of claim 1, wherein said receiving user input to the diagram specifying values for one or more of said timing and triggering attributes of the device comprises one or more of:
receiving user input selecting a position of a switch in the diagram;
receiving user input selecting a value from a list of values;
receiving user input to a data field in the diagram; and
receiving user input to an icon.

20. The method of claim 1, wherein the diagram is specific to:
a hardware product; or
a hardware product family.

21. The method of claim 1, wherein the device comprises a plurality of coupled devices.

22. The method of claim 1, further comprising:
displaying a state diagram, wherein said state diagram indicates effects of said modifying the diagram upon operation of the device.

23. The method of claim 22, further comprising:
receiving user input to the state diagram modifying a configuration of the state diagram, thereby generating a modified state diagram; and
modifying the diagram in accordance with said modified state diagram.

24. The method of claim 1, wherein said modifying the diagram in accordance with said specified one or more timing and triggering attributes compnses:
modifying the diagram in accordance with said specified one or more timing and triggering attributes only if said specified one or more timing and triggering attributes are valid, thereby maintaining a valid state of the configuration of the device.

25. The method of claim 24, further comprising:
graphically indicating to the user when a specified attribute is invalid.

26. The method of claim 1, the method further comprising:
prior to said displaying the diagram, receiving input specifying said device.

27. The method of claim 1, the method further comprising:
prior to said displaying the diagram, performing a discovery process on said device to determine a current configuration of the device;
wherein said displaying the diagram that graphically represents user-configurable timing and triggering components of a device comprises:
displaying the diagram in accordance with said current configuration of the device.

28. The method of claim 1, further comprising:
generating program code based on said diagram, wherein said program code is executable to configure timing and triggering for said device.

29. The method of claim 28, wherein said program code comprises textual program code.

30. The method of claim 28, wherein said program code comprises graphical program code.

31. The method of claim 30, wherein said graphical program code comprises a data flow graphical program.

32. The method of claim 1, further comprising:
initiating said displaying the diagram from a graphical configuration utility.

33. The method of claim 1, further comprising:
configuring timing and triggering for said device using the specified one or more timing and triggering attributes.

34. A system for graphically specifying hardware timing and triggering, the system comprising:
a computer, comprising:
a processor; and
a memory medium coupled to the processor;
wherein the memory medium stores program instructions which are executable by the processor to:
display a diagram that graphically represents user-configurable timing and triggering components of a device, and wherein timing and triggering for said device is determined by a plurality of timing and triggering attributes;
receive user input to the diagram specifying one or more of said timing and triggering attributes of the device;
modify said diagram in accordance with said specified timing and triggering attributes, wherein said diagram represents configuration of said user-configurable timing and triggering components of the device; and
store said specified values of one or more timing and triggering attributes, wherein said one or more timing and triggering attributes are usable to configure timing and triggering for said device.

35. A system for graphically specifying hardware timing and triggering, the system comprising:
means for displaying a diagram that graphically represents user-configurable timing and triggering components of a device, and wherein timing and triggering for said device is determined by a plurality of timing and triggering attributes;
means for receiving user input to the diagram specifying one or more of said timing and triggering attributes of the device;
means for modifying said diagram in accordance with said specified timing and triggering attributes, wherein said diagram represents configuration of said user-configurable timing and triggering components of the device; and
means for storing said specified values of one or more timing and triggering attributes, wherein said one or more timing and triggering attributes are usable to configure timing and triggering for said device.

36. A carrier medium which stores program instructions for graphically specifying hardware timing and triggering, wherein the program instructions are executable by a processor to perform:
displaying a diagram that graphically represents user-configurable timing and triggering components of a device, and wherein timing and triggering for said device is determined by a plurality of timing and triggering attributes;
receiving user input to the diagram specifying one or more of said timing and triggering attributes of the device;
modifying said diagram in accordance with said specified timing and triggering attributes, wherein said diagram represents configuration of said user-configurable timing and triggering components of the device; and
storing said specified values of one or more timing and triggering attributes, wherein said one or more timing and triggering attributes are usable to configure timing and triggering for said device.

37. A computer-implemented method for graphically specifying hardware timing and triggering, the method comprising:
displaying a diagram that graphically represents user-configurable timing and triggering components of a device, and wherein timing and triggering for said device is determined by a plurality of timing and triggering attributes;
receiving user input to the diagram specifying one or more of said timing and triggering attributes of the device;
programmatically configuring said diagram in accordance with said specified timing and triggering attributes, wherein said diagram represents configuration of said user-configurable timing and triggering components of the device; and
storing said specified values of one or more timing and triggering attributes, wherein said one or more timing and triggering attributes are usable to configure timing and triggering for said device.

38. A computer-implemented method for graphically specifying hardware timing, the method comprising:
displaying a diagram that graphically represents user-configurable timing components of a device, and wherein timing for said device is determined by a plurality of timing attributes;
receiving user input to the diagram specifying one or more of said timing attributes of the device;
modifying said diagram in accordance with said specified timing attributes, wherein said diagram represents configuration of said user-configurable timing components of the device; and
storing said specified values of one or more timing attributes, wherein said one or more timing attributes are usable to configure timing for said device.

39. A computer-implemented method for graphically specifying hardware triggering, the method comprising:
- displaying a diagram that graphically represents user-configurable triggering components of a device, and wherein triggering for said device is determined by a plurality of triggering attributes;
- receiving user input to the diagram specifying one or more of said triggering attributes of the device;
- modifying said diagram in accordance with said specified triggering attributes, wherein said diagram represents configuration of said user-configurable triggering components of the device; and
- storing said specified values of one or more triggering attributes, wherein said one or more triggering attributes are usable to configure triggering for said device.

40. A computer-implemented method for graphically specifying hardware signal paths, the method comprising:
- displaying a diagram that graphically represents user-configurable signal routing components of a device, and wherein signal routing for said device is determined by a plurality of signal routing attributes;
- receiving user input to the diagram specifying one or more of said signal routing attributes of the device;
- modifying said diagram in accordance with said specified signal routing attributes, wherein said diagram represents configuration of said user-configurable signal routing components of the device; and
- storing said specified values of one or more signal routing attributes, wherein said one or more signal routing attributes are usable to configure signal routing for said device.

41. A computer-implemented method for graphically specifying hardware timing and triggering, the method comprising:
- displaying a diagram that graphically represents user-configurable timing and triggering components of a device, and wherein timing and triggering for said device is determined by a plurality of timing and triggering attributes;
- receiving user input to the diagram specifying one or more of said timing and triggering attributes of the device;
- modifying said diagram in accordance with said specified one or more timing and triggering attributes, wherein said diagram represents configuration of said user-configurable timing and triggering components of the device; and
- storing said specified one or more timing and triggering attributes, wherein said one or more timing and triggering attributes are usable to configure timing and triggering for said device;
- wherein said modifying the diagram in accordance with said specified one or more timing and triggering attributes comprises:
  - automatically computing all of said plurality of timing and triggering attributes that are dependent on said specified one or more timing and triggering attributes.

42. The method of claim 41, wherein said automatically computing all of said plurality of timing and triggering attributes that are dependent on said specified one or more timing and triggering attributes comprises:
- automatically computing attributes which are circularly dependent on said specified one or more timing and triggering attributes.

43. The method of claim 42, further comprising:
- automatically re-computing at least one of said specified one or more timing and triggering attributes in response to said automatically computing attributes.

* * * * *

UNITED STATES PATENT AND TRADEMARK OFFICE
CERTIFICATE OF CORRECTION

| | | |
|---|---|---|
| PATENT NO. | : 7,134,109 B2 | Page 1 of 1 |
| APPLICATION NO. | : 10/361661 | |
| DATED | : November 7, 2006 | |
| INVENTOR(S) | : Timothy J. Hayles | |

It is certified that error appears in the above-identified patent and that said Letters Patent is hereby corrected as shown below:

In the Claims:

Column 29 Lines 20 - 21, please delete "wherein said progranimatically configuring the" and substitute -- wherein said programmatically configuring the --;

Column 30 Line 60, please delete "triggering attributes compnses:" and substitute -- triggering attributes comprises: --.

Signed and Sealed this

Sixth Day of March, 2007

JON W. DUDAS
*Director of the United States Patent and Trademark Office*